United States Patent
Chong et al.

(10) Patent No.: US 10,317,756 B2
(45) Date of Patent: Jun. 11, 2019

(54) SUBSTRATE STRUCTURE AND METHOD OF MANUFACTURING SUBSTRATE STRUCTURE

(71) Applicant: Samsung Display Co., Ltd., Yongin-si, Gyeonggi-Do (KR)

(72) Inventors: Joonggun Chong, Yongin-si (KR); Yonghwan Shin, Asan-si (KR); Kwangho Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/870,493

(22) Filed: Jan. 12, 2018

(65) Prior Publication Data

US 2018/0284519 A1    Oct. 4, 2018

(30) Foreign Application Priority Data

Mar. 28, 2017   (KR) ........................ 10-2017-0039317

(51) Int. Cl.
| | | |
|---|---|---|
| *G02F 1/1345* | (2006.01) | |
| *G02F 1/1335* | (2006.01) | |
| *G02F 1/1362* | (2006.01) | |
| *H01L 21/768* | (2006.01) | |
| *H01L 21/02* | (2006.01) | |
| *H01L 27/12* | (2006.01) | |
| *G02F 1/1343* | (2006.01) | |

(52) U.S. Cl.
CPC ........ *G02F 1/13458* (2013.01); *G02F 1/1335* (2013.01); *G02F 1/1362* (2013.01); *G02F 1/134309* (2013.01); *H01L 21/02554* (2013.01); *H01L 21/768* (2013.01); *H01L 27/124* (2013.01); *H01L 27/1248* (2013.01); *H01L 27/1262* (2013.01)

(58) Field of Classification Search
CPC ........... G02F 1/13458; G02F 1/134309; G02F 1/1362; G02F 1/1335; H01L 27/1248; H01L 21/768; H01L 21/02554; H01L 27/124; H01L 27/1262
USPC ........................................................ 257/68
See application file for complete search history.

(56) References Cited

U.S. PATENT DOCUMENTS

2010/0187538 A1*   7/2010   Koo ...................... H01L 27/124
                                                                    257/72

FOREIGN PATENT DOCUMENTS

KR          10-1362480 B1     2/2014

* cited by examiner

*Primary Examiner* — Fernando L Toledo
*Assistant Examiner* — Adam S Bowen
(74) *Attorney, Agent, or Firm* — Innovation Counsel LLP

(57) ABSTRACT

A display substrate includes a base substrate, a gate metal pattern, a semiconductor layer, and a data metal pattern. The base substrate includes a display area and a peripheral area. The gate metal pattern includes a gate electrode of a transistor and includes a gate metal member disposed on the peripheral area. The transistor is disposed on the display area. The semiconductor layer includes a channel portion of the transistor and includes a semiconductor member disposed on the peripheral area. The data metal pattern includes a source electrode of the transistor and includes a data metal member disposed on the peripheral area, electrically connected to the gate metal member, and directly contacting the semiconductor member. A maximum thickness of the data metal member in a direction perpendicular to the base substrate is greater than a maximum thickness of the semiconductor member in the direction.

20 Claims, 35 Drawing Sheets

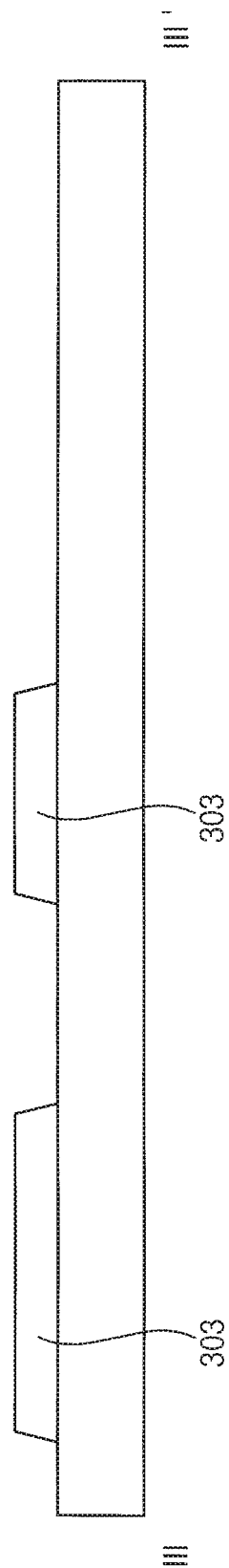

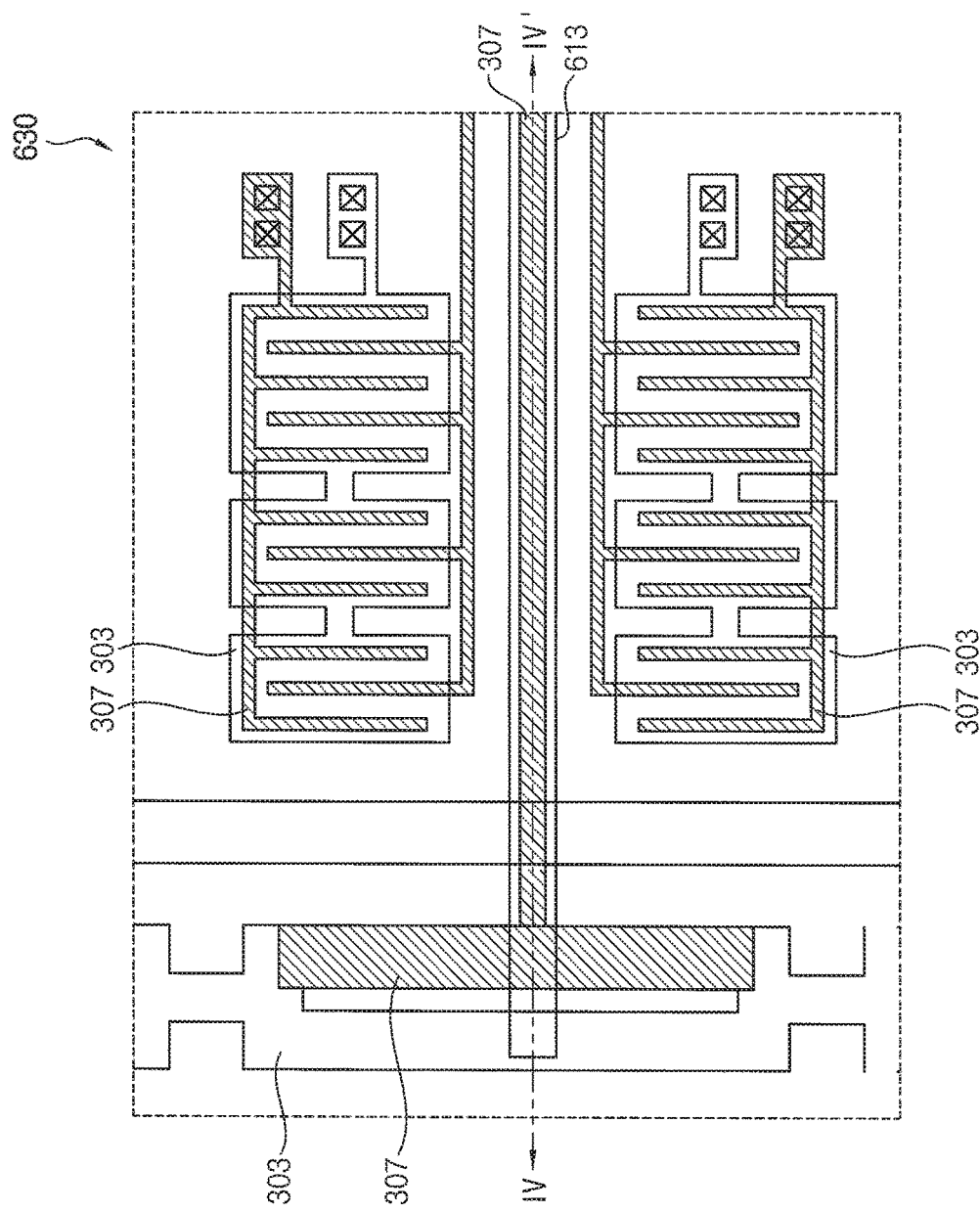

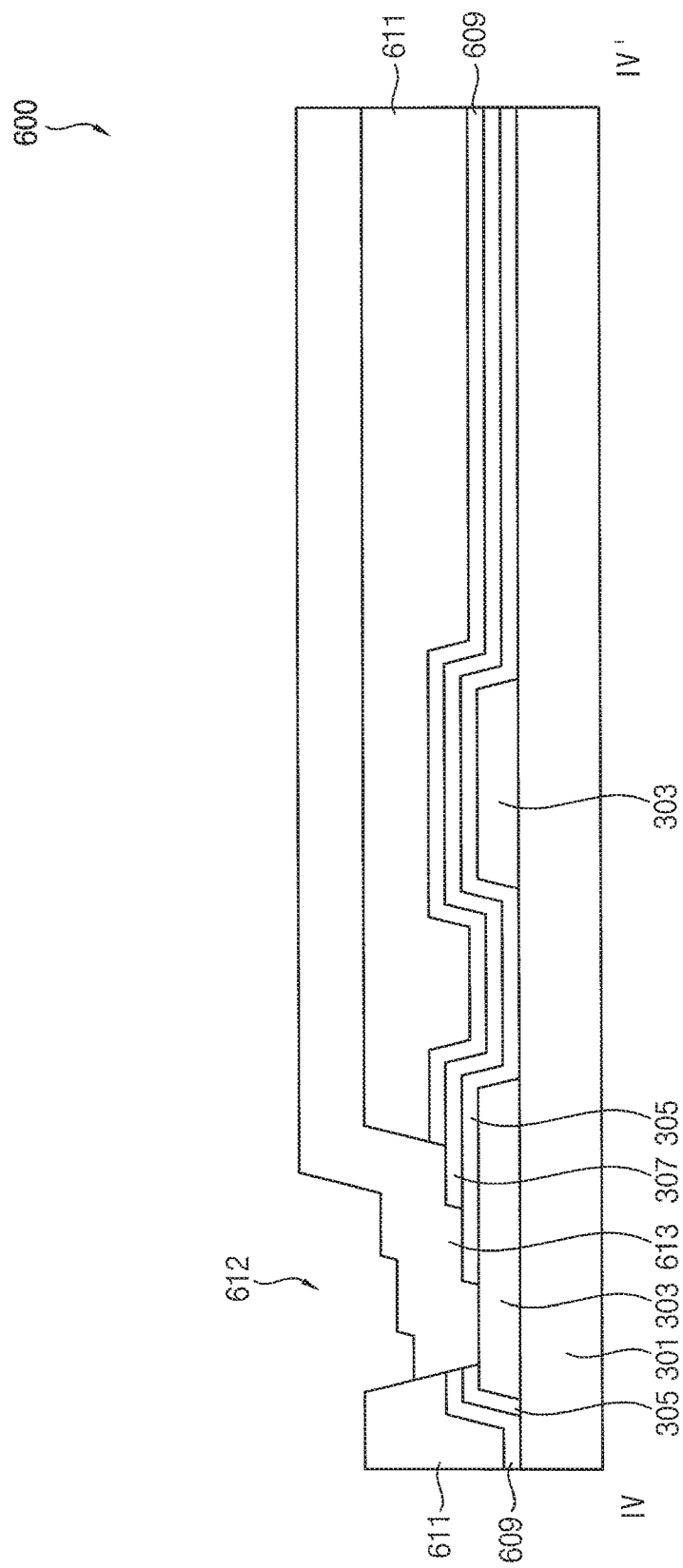

SUBSTRATE STRUCTURE AND METHOD OF MANUFACTURING SUBSTRATE STRUCTURE

RELATED APPLICATION

This application claims priority under 35 U.S.C. § 119 to Korean Patent Application No. 10-2017-0039317, filed on Mar. 28, 2017 in the Korean Intellectual Property Office (KIPO); the contents of the Korean Patent Application are herein incorporated by reference.

BACKGROUND

1. Field

The technical field may be related to a substrate structure and a method of manufacturing the substrate structure. The substrate structure may be used and/or included in a display apparatus.

2. Description of the Related Art

A display apparatus typically includes a display panel and a display panel driving apparatus.

The display panel may include a lower substrate, an upper substrate, and a liquid crystal layer. The lower substrate includes a first base substrate; a gate line, a data line, and a thin film transistor disposed on the first base substrate; and a pixel electrode electrically connected to the thin film transistor. The upper substrate includes a second base substrate facing the first base substrate, a color filter formed on the second base substrate, and a common electrode disposed on the color filter. The liquid crystal layer is formed between the lower substrate and the upper substrate. Orientations of liquid crystal molecules of the liquid crystal layer may be changed by an electric field between the pixel electrode and the common electrode.

The display panel driving apparatus may include a gate driving part, a data driving part, and a timing controlling part. The gate driving part may output a gate signal to the gate line. The data driving part may output a data signal to the data line. The timing controlling part may control timings of the gate driving part and the data driving part.

If the resistance of the data line is undesirably high, a charge rate of the data signal to the pixel electrode may be undesirably low, and thus image display quality of the display apparatus may be unsatisfactory.

SUMMARY

Example embodiments may be related to a display substrate structure for implementing satisfactory image display quality of a display apparatus.

Example embodiments may be related to a method of manufacturing a display substrate structure.

According to an embodiment, a display substrate includes a base substrate, a gate metal pattern, a gate insulating layer, a semiconductor layer, a first insulating layer and a data metal pattern. The base substrate includes a display area displaying an image, and a peripheral area adjacent to the display area. The gate metal pattern is disposed on the base substrate of the peripheral area. The gate insulating layer is disposed on the gate metal pattern. The semiconductor layer is disposed on the gate insulating layer of the peripheral area and has a first thickness. The first insulating layer is disposed on the semiconductor layer. The data metal pattern is disposed on the first insulating layer of the peripheral area, has a second thickness greater than the first thickness of the semiconductor layer, has a portion making contact with the semiconductor layer, and is electrically connected to the gate metal pattern.

In an embodiment, the display substrate may further include a connection electrode configured to electrically connect the gate metal pattern to the data metal pattern in the peripheral area.

In an embodiment, the connection electrode may be disposed on the first insulating layer.

In an embodiment, the connection electrode may electrically connect the gate metal pattern to the data metal pattern through a contact hole formed through the first insulating layer and the gate insulating layer.

In an embodiment, the display substrate may further include a second insulating layer disposed on the data metal pattern in the peripheral area.

In an embodiment, the connection electrode may be disposed on the second insulating layer.

In an embodiment, the connection electrode may electrically connect the gate metal pattern to the data metal pattern through a contact hole formed through the first insulating layer, the second insulating layer and the gate insulating layer.

In an embodiment, the gate metal pattern may be directly connected to the data metal pattern.

In an embodiment, the peripheral area may include a fan out area disposed between a data driving part which outputs a data signal and a data line which is disposed in the display area, and the fan out area may include a static electricity prevention circuit.

In an embodiment, the gate metal pattern, the semiconductor layer and the data metal pattern may form the static electricity prevention circuit.

In an embodiment, the display substrate may further include a gate driving part disposed in the peripheral area and configured to output a gate signal, and the gate metal pattern, the semiconductor layer and the data metal pattern may form the gate driving part.

In an embodiment, the data metal pattern may make contact with the semiconductor layer along an extension direction of the semiconductor layer in the peripheral area.

According to an embodiment, a method of manufacturing a display substrate includes forming a gate metal pattern on a base substrate of a peripheral area, forming a gate insulating layer on the gate metal pattern, forming a semiconductor layer having a first thickness on the gate insulating layer of the peripheral area, forming a first insulating layer on the semiconductor layer, and forming a data metal pattern having a second thickness greater than the first thickness of the semiconductor layer, having a portion making contact with the semiconductor layer, and electrically connected to the gate metal pattern, on the first insulating layer of the peripheral area. Here, the base substrate includes a display area displaying an image, and the peripheral area adjacent to the display area.

In an embodiment, the method may further include forming a connection electrode electrically connecting the gate metal pattern to the data metal pattern, on the first insulating layer of the peripheral area.

In an embodiment, the connection electrode may electrically connect the gate metal pattern to the data metal pattern through a contact hole formed through the first insulating layer and the gate insulating layer.

In an embodiment, the method may further include forming a second insulating layer on the data metal pattern of the peripheral area.

In an embodiment, the method may further include forming a connection electrode electrically connecting the gate metal pattern to the data metal pattern, on the second insulating layer of the peripheral area.

In an embodiment, the connection electrode may electrically connect the gate metal pattern to the data metal pattern through a contact hole formed through the first insulating layer, the second insulating layer and the gate insulating layer.

In an embodiment, the data metal pattern may make contact with the semiconductor layer along an extension direction of the semiconductor layer in the peripheral area.

In an embodiment, the gate metal pattern may be directly connected to the data metal pattern.

An embodiment may be related to a substrate structure. The substrate structure may include a base substrate, a gate metal pattern, a gate insulating member, a semiconductor layer, a first insulating layer, and a data metal pattern. The base substrate may include a display area and a peripheral area adjacent to the display area. The gate metal pattern may include a gate electrode of a transistor disposed on the display area and may include a gate metal member disposed on the peripheral area. The gate electrode of the transistor may overlap a face of the base substrate. The gate insulating member may be disposed on the gate metal pattern. The semiconductor layer may be disposed on the gate insulating member, may include a channel portion of the transistor disposed on the display area, and may include a semiconductor member disposed on the peripheral area. The first insulating layer may be disposed on the semiconductor layer. The data metal pattern may be disposed on the first insulating layer, may include a source electrode of the transistor disposed on the display area, and may include a data metal member disposed on the peripheral area. The data metal member may directly contact the semiconductor member and may be electrically connected to the gate metal member. A maximum thickness of the data metal member in a direction perpendicular to the face of the base substrate may be greater than a maximum thickness of the semiconductor member in the direction perpendicular to the face of the base substrate.

The substrate structure may include a connection electrode electrically connecting the gate metal member to the data metal member.

The connection electrode may directly contact each of the gate metal member and the data metal member.

The connection electrode may electrically connect the gate metal member to the data metal member through a contact hole formed through both the first insulating layer and the gate insulating member.

The substrate structure may include a second insulating layer disposed on the data metal member, wherein each of the first insulating layer, the gate insulating member, and the data metal member may be disposed between the second insulating layer and the base substrate.

The connection electrode may directly contact the second insulating layer.

The connection electrode may electrically connect the gate metal member to the data metal member through a contact hole formed through the first insulating layer, the second insulating layer, and the gate insulating member.

The gate metal member may directly contact the data metal member.

The substrate structure may include a data driving part for outputting a data signal. The gate metal member, the semiconductor member, and the data metal member may be disposed between the display area and the data driving part.

The gate metal member, the semiconductor member, and the data metal member may form at least one of a static electricity prevention diode, a static electricity prevention transistor and a static electricity prevention capacitor.

The gate metal member, the semiconductor member, and the data metal member may form a gate driving part for providing gate signals.

The data metal member may directly contact at least three faces of the semiconductor member.

An embodiment may be related to a method of manufacturing a substrate structure. The method may include the following steps: forming a gate metal pattern on a base substrate, the base substrate including a display area and a peripheral area adjacent to the display area, the gate metal pattern including a gate electrode of a transistor disposed on the display area and including a gate metal member disposed on the peripheral area, the gate electrode of the transistor overlapping a face of the base substrate; forming a gate insulating member on the gate metal pattern; forming a semiconductor layer on the gate insulating member, the semiconductor layer including a channel portion of the transistor disposed on the display area and including a semiconductor member disposed on the peripheral area; forming a first insulating layer on the semiconductor layer; and forming a data metal pattern on the first insulating layer, the data metal pattern including a source electrode of the transistor disposed on the display area and including a data metal member disposed on the peripheral area. The data metal member may directly contact the semiconductor member and may be electrically connected to the gate metal member. A maximum thickness of the data metal member in a direction perpendicular to the face of the base substrate may be greater than a maximum thickness of the semiconductor member in the direction perpendicular to the face of the base substrate.

The method may include forming a connection electrode electrically connecting the gate metal member to the data metal member.

The connection electrode may electrically connect the gate metal member to the data metal member through a contact hole formed through both the first insulating layer and the gate insulating member.

The method may include forming a second insulating layer on the data metal member. Each of the first insulating layer, the gate insulating member, and the data metal member may be disposed between the second insulating layer and the base substrate.

The method may include forming a connection electrode electrically connecting the gate metal member to the data metal member. The connection electrode may directly contact the second insulating layer.

The connection electrode may electrically connect the gate metal member to the data metal member through a contact hole formed through the first insulating layer, the second insulating layer, and the gate insulating member.

The data metal member may directly contact at least three faces of the semiconductor member.

The data metal member may directly contact a first portion of the semiconductor member through a first contact hole. The data metal member may directly contact a second portion of the semiconductor member through a second contact hole spaced from the first contact hole. The first portion of the semiconductor member may be disposed closer to the base substrate than the second portion of the semiconductor member.

The gate metal member may directly contact the data metal member.

According to embodiments, a thickness of a data metal member is greater than a thickness of a semiconductor member, such that a cross-section of the data member may be sufficiently large. Therefore, a resistance of the data metal pattern is sufficiently low, and thus a charge rate of a pixel voltage charged in a pixel electrode of a pixel may be sufficiently high. Thus, image display quality of an associated display apparatus may be satisfactory.

BRIEF DESCRIPTION OF THE DRAWINGS

FIG. 7A, FIG. 7B, FIG. 7C, FIG. 7D, FIG. 7E, FIG. 7F, FIG. 7G FIG. 7H, FIG. 7I, FIG. 7J, FIG. 7K, FIG. 7L, FIG. 7M, FIG. 7N, and FIG. 7O are cross-sectional views illustrating a method of manufacturing a display substrate structure according to an embodiment.

FIG. 12 is a plan view illustrating a peripheral area of a display substrate structure in which a gate driving part is disposed according to an embodiment.

FIG. 13 is a cross-sectional view taken along a line IV-IV' of FIG. 12 according to an embodiment.

DETAILED DESCRIPTION

Example embodiments will be explained in detail with reference to the accompanying drawings. Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively. In this application, some occurrences of "a/the gate metal pattern" may mean "a/the gate metal member of a/the gate metal pattern"; some occurrences of "a/the semiconductor layer" may mean "a/the semiconductor member of a/the semiconductor layer"; some occurrences of "a/the data metal pattern" may mean "a/the data metal member of a/the data metal pattern"; the term "display substrate" may mean "substrate structure for use in a display device".

Figure 1:
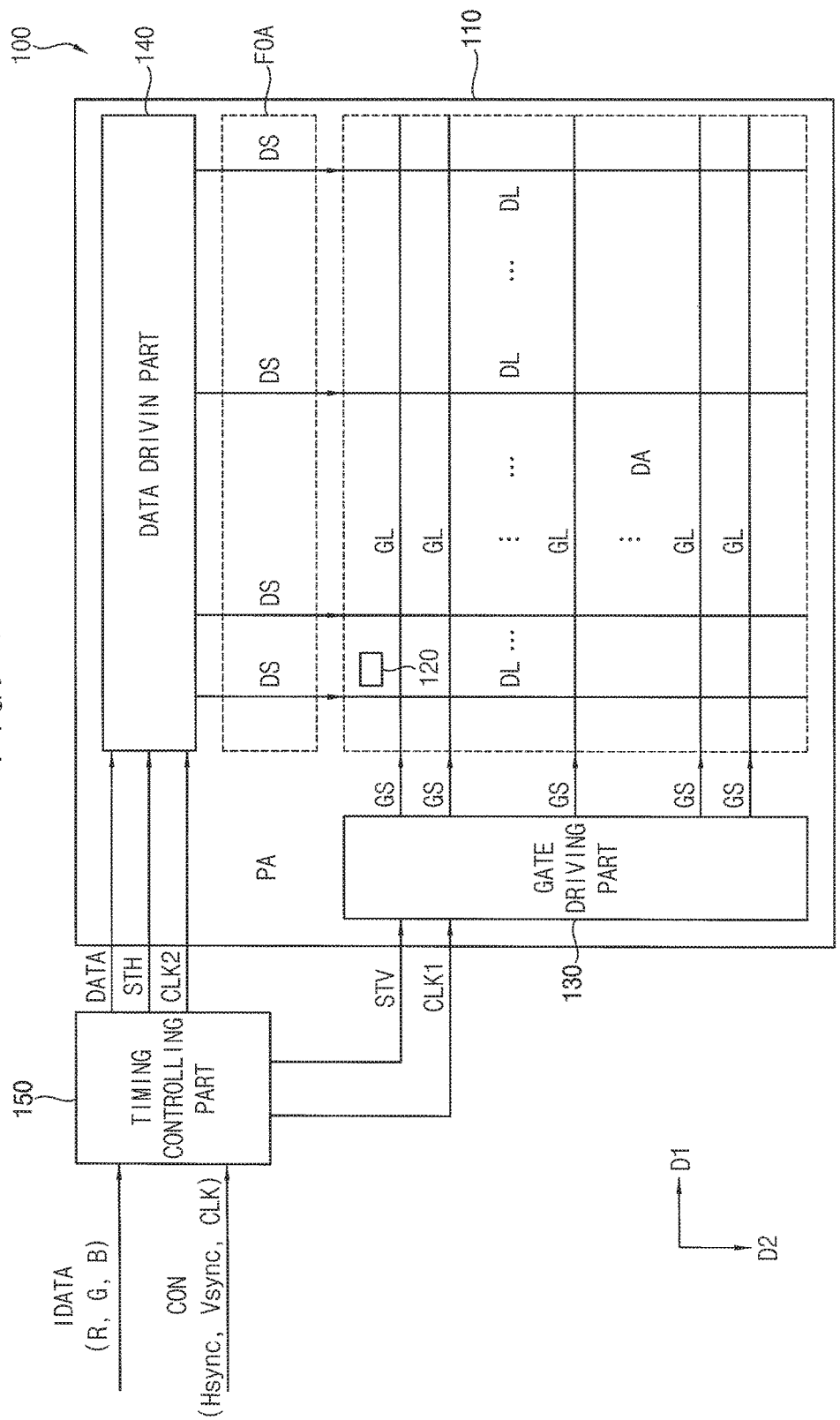
FIG. 1 is a block diagram illustrating a display apparatus according to an embodiment.

FIG. 1 is a block diagram illustrating a display apparatus 100 according to an embodiment.

Referring to FIG. 1, the display apparatus 100 includes a display panel 110, a gate driving part 130, a data driving part 140, and a timing controlling part 150.

The display panel 110 includes (a display substrate structure that includes) a display area DA and a peripheral area PA. The display area DA receives a data signal DS from the data driving part 140 to display an image. The display area DA includes gate lines GL, data lines DL and pixels 120. The gate lines GL extend in a first direction D1 and are arranged in a second direction D2 substantially perpendicular to the first direction D1 The data lines DL extend in the second direction D2 and are arranged in the first direction D1. In an embodiment, the first direction D1 may be parallel to a long side of the display panel 110, and the second direction D2 may be parallel to a short side of the display panel 110.

The pixels 120 are defined by the gate lines GL and the data lines DL. For example, a pixel 120 may include a thin film transistor electrically connected to a gate line GL and a data line DL, a liquid crystal capacitor, and a storage capacitor connected to the thin film transistor. In an embodiment, the display panel 110 may be a liquid crystal display panel.

The peripheral area PA neighbors (and may surround) the display area DA. The peripheral area PA may include a fan out area FOA. The fan out area FOA is disposed between the data driving part 140 and the display area DA. A static electricity prevention circuit may be disposed in the fan out area FOA. For example, the static electricity prevention circuit may include at least one of a static electricity prevention diode, a static electricity prevention transistor, and a static electricity prevention capacitor.

The display panel 110 may include a display substrate (or substrate structure). For example, the display panel 110 may be a liquid crystal display panel that includes a display substrate including a thin film transistor and a pixel electrode, a facing substrate facing the display substrate and including a common electrode, and a liquid crystal layer interposed between the display substrate and the facing substrate.

The gate driving part 130, the data driving part 140, and the timing controlling part 150 may form a display panel driving apparatus for driving the display panel 110.

The gate driving part 130 generates gate signals GS in response to a vertical start signal STV and a first clock signal CLK1 provided from the timing controlling part 150, and outputs the gate signals GS to the gate lines GL, respectively. For example, the gate driving part 130 may include an Amorphous Silicon Gate (ASG), poly silicon and an oxide semiconductor.

The data driving part 140 receives image data DATA from the timing controlling part 150, generates the data signal DS using the image data DATA, and outputs the data signal DS to the data line DL in response to a horizontal start signal STH and a second clock signal CLK2 provided from the timing controlling part 150. The data driving part 140 may be disposed in the peripheral area PA of the display panel 110.

The timing controlling part 150 receives input image data IDATA and a control signal CON from an outside. The input image data IDATA may include red data R, green data G and blue data B. The control signal CON may include a horizontal synchronous signal Hsync, a vertical synchronous signal Vsync and a clock signal CLK. The timing controlling part 150 generates the horizontal start signal STH using the horizontal synchronous signal Hsync and outputs the horizontal start signal STH to the data driving part 140. In addition, the timing controlling part 150 generates the vertical start signal STV using the vertical synchronous signal Vsync and outputs the vertical start signal STV to the gate driving part 130. In addition, the timing controlling part 150 generates the first clock signal CLK1 and the second clock signal CLK2 using the clock signal CLK, outputs the first clock signal CLK1 to the gate driving part 130, and outputs the second clock signal CLK2 to the data driving part 140.

Figure 2:
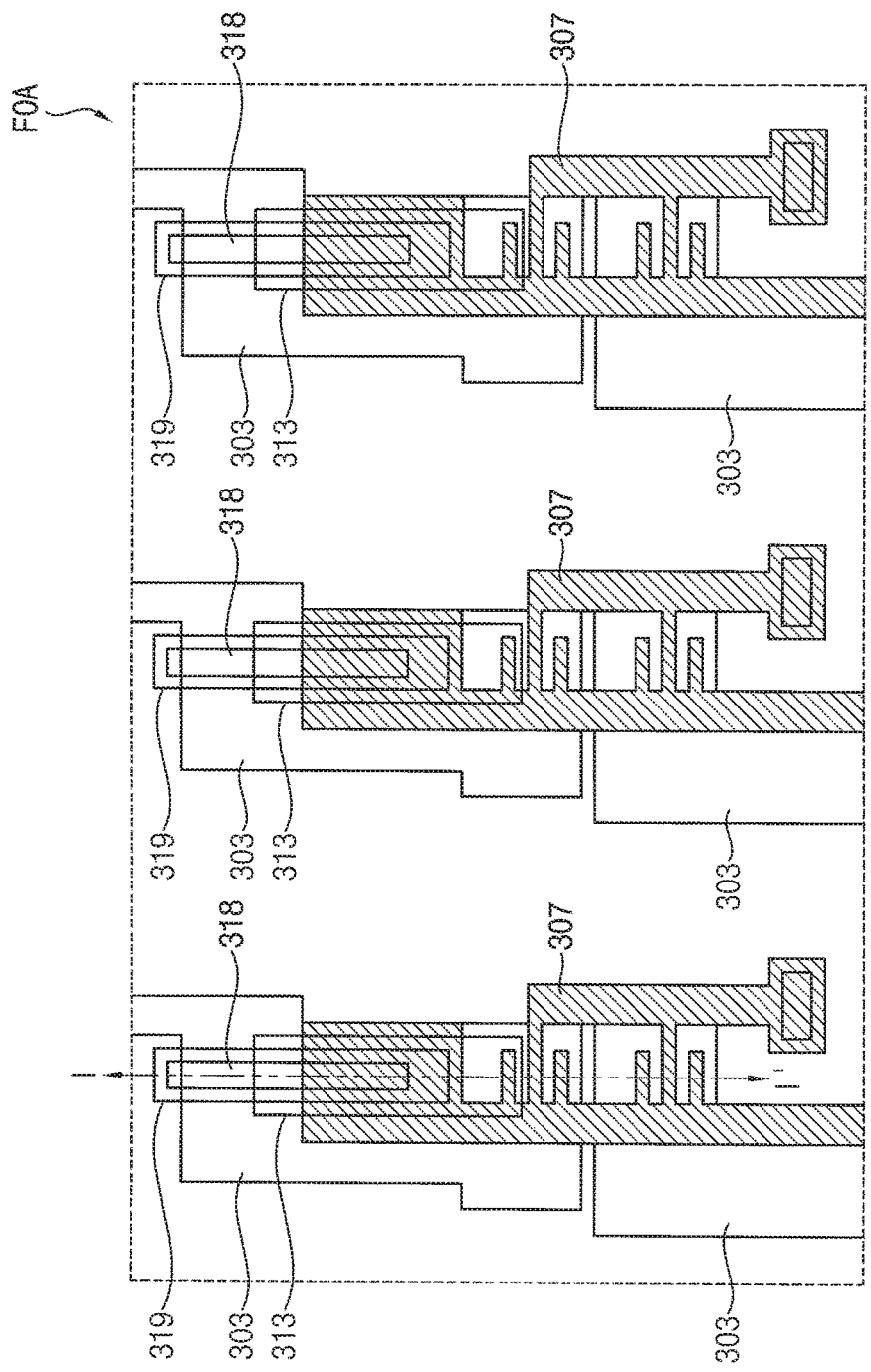
FIG. 2 is a plan view illustrating a fan out area of a display substrate structure according to an embodiment.
Figure 3:
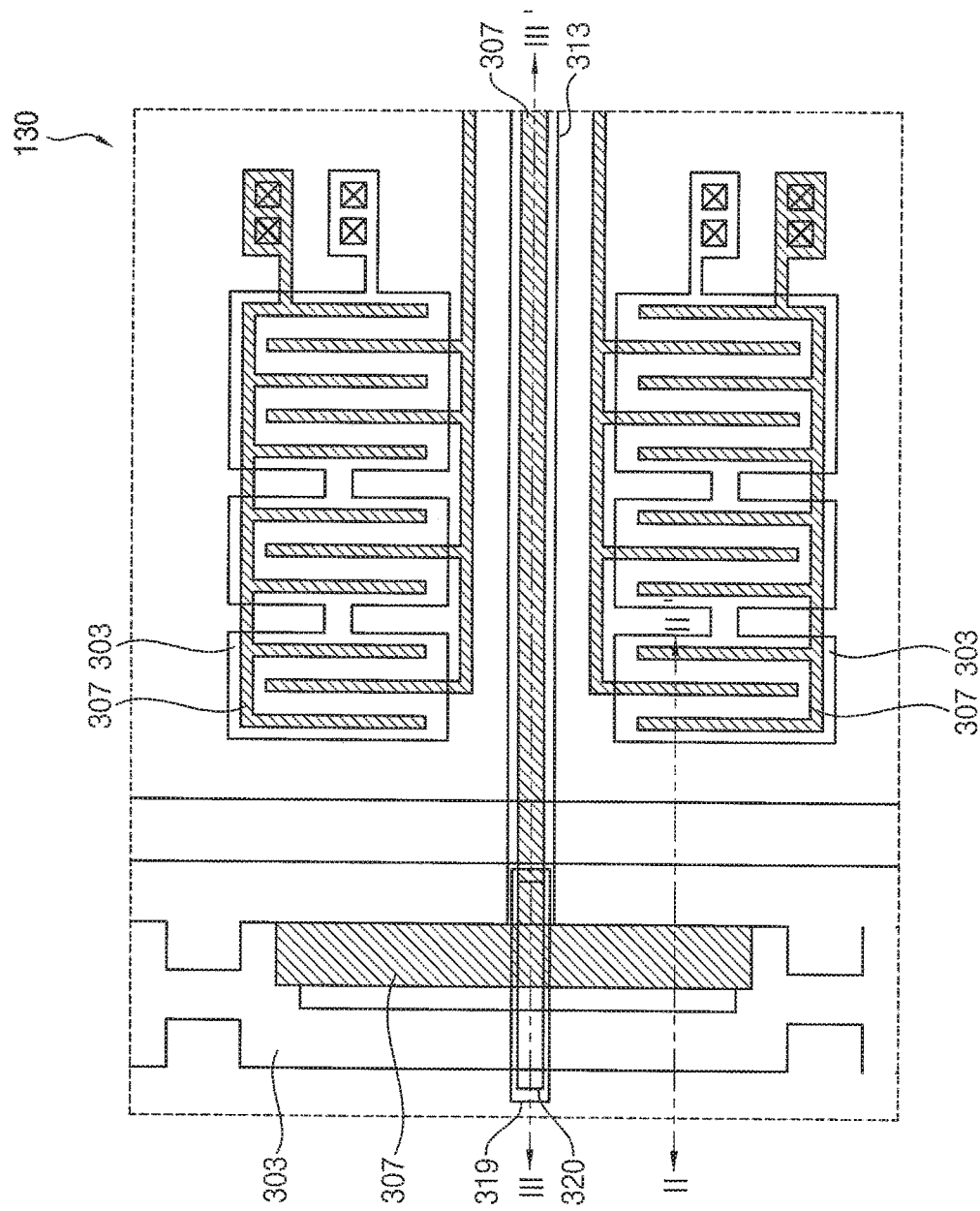
FIG. 3 is a plan view illustrating a peripheral area of a display substrate structure in which a gate driving part of FIG. 1 is disposed according to an embodiment.
Figure 4:
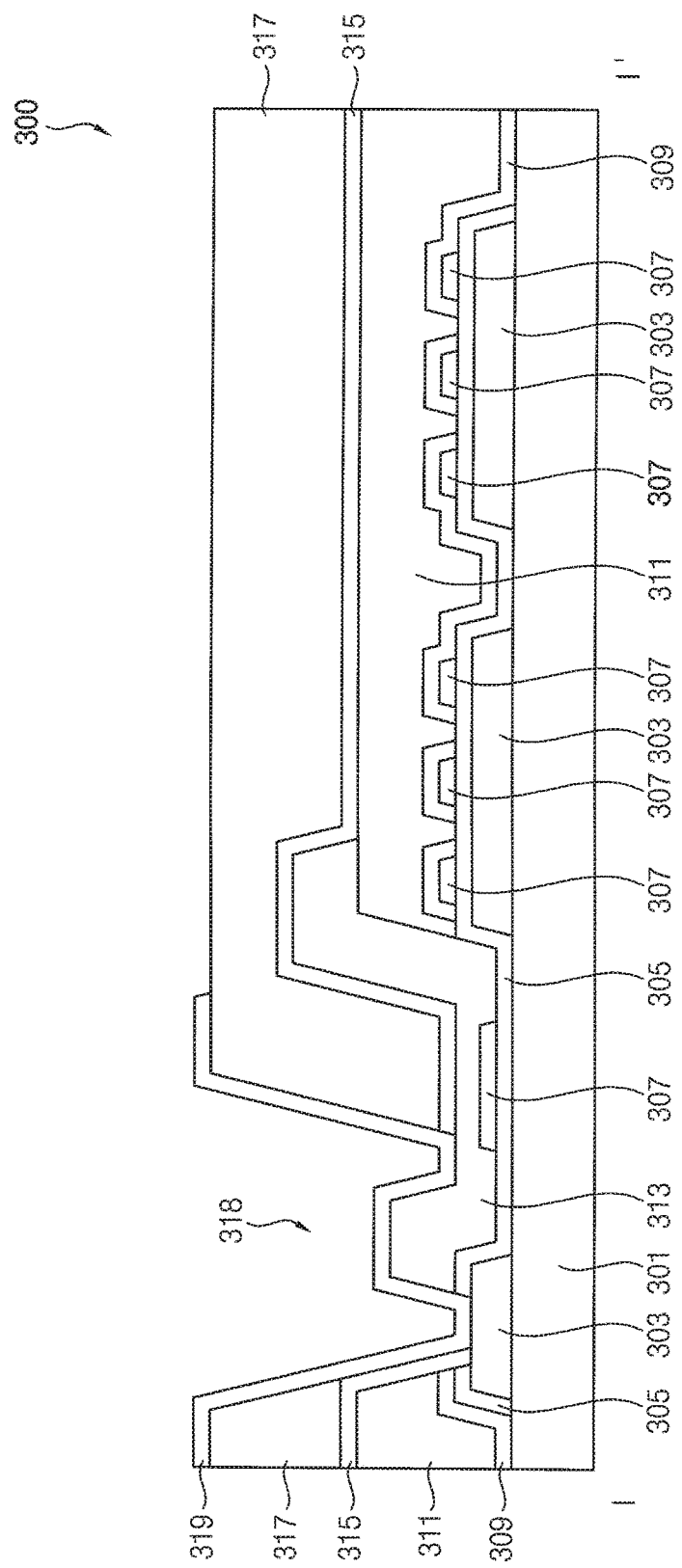
FIG. 4 is a cross-sectional view taken along a line I-I' of FIG. 2 according to an embodiment.
Figure 5:
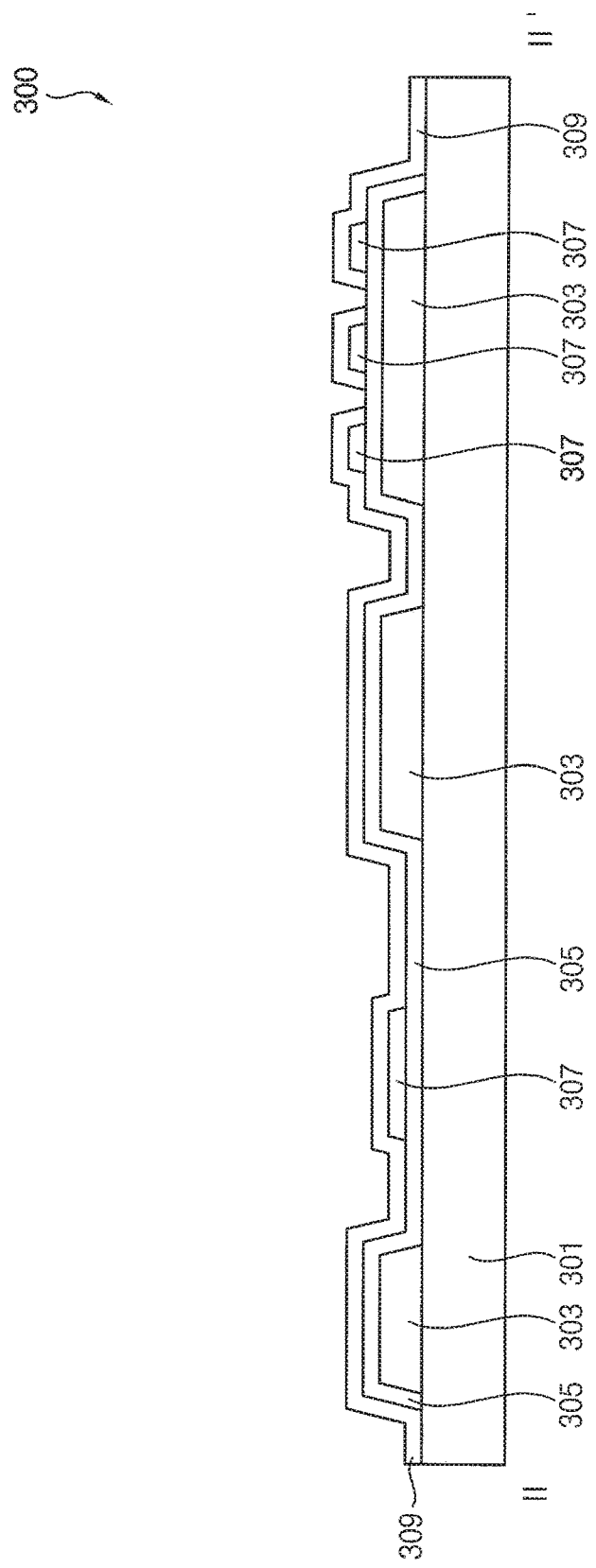
FIG. 5 is a cross-sectional view taken along a line II-II' of FIG. 3 according to an embodiment.
Figure 6:
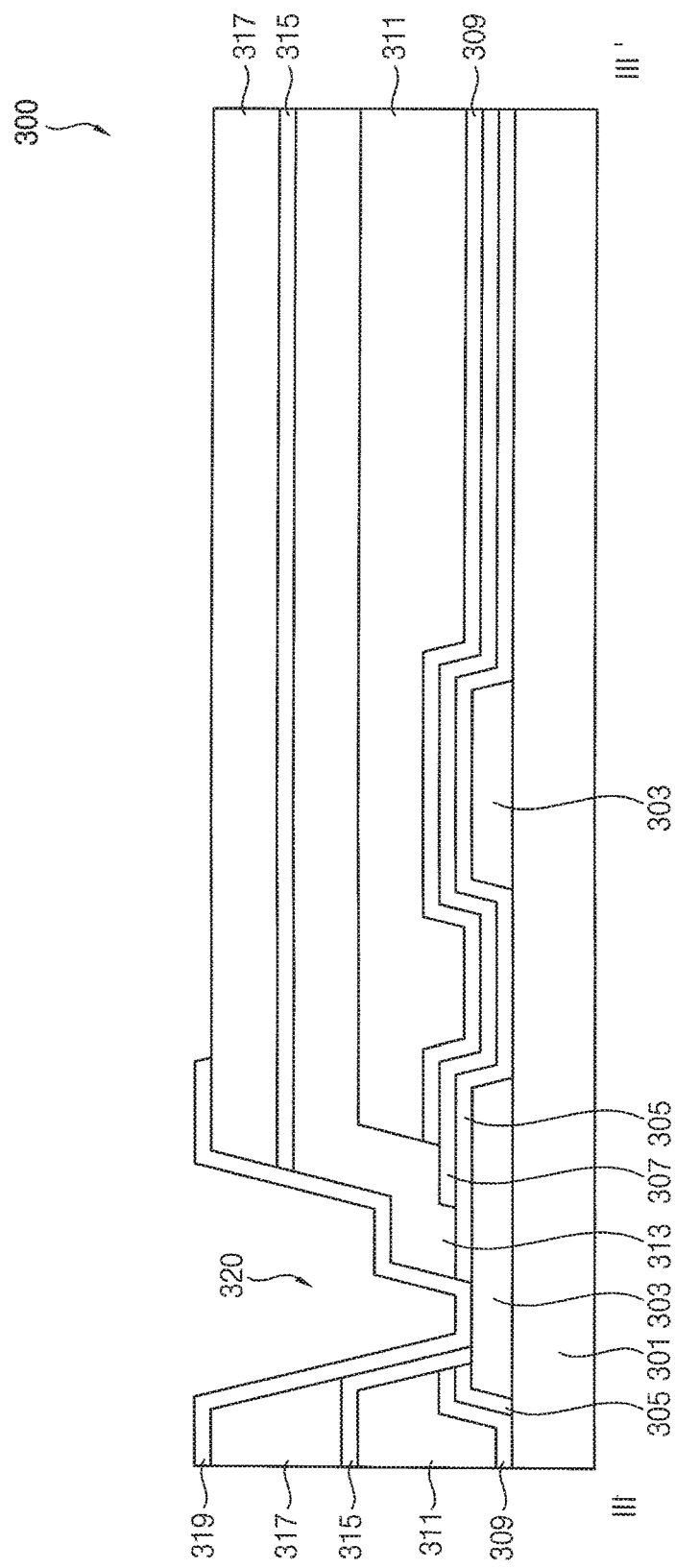
FIG. 6 is a cross-sectional view taken along a line III-III' of FIG. 3 according to an embodiment.

FIG. 2 is a plan view illustrating the fan out area FOA of FIG. 1. FIG. 3 is a plan view illustrating the peripheral area PA in which the gate driving part 130 of FIG. 1 is disposed. FIG. 4 is a cross-sectional view taken along a line I-I' of FIG. 2. FIG. 5 is a cross-sectional view taken along a line II-II' of FIG. 3. FIG. 6 is a cross-sectional view taken along a line III-III' of FIG. 3.

Referring to FIGS. 1 to 6, the display substrate 300 includes a base substrate 301, a gate metal pattern 303, a gate insulating layer 305, a semiconductor layer 307, a first passivation layer 309, a first insulating layer 311, a data metal pattern 313, a second passivation layer 315, a second insulating layer 317, and a connection electrode 319.

The base substrate 301 may be a glass substrate or a plastic substrate. The base substrate 301 may include a display area DA and a peripheral area PA.

The gate metal pattern 303 is disposed on the base substrate 301. The gate metal pattern may include a gate metal member disposed in the peripheral area PA. The gate metal pattern 303 may have a single layer structure including at least one of copper (Cu), silver (Ag), chrome (Cr), molybdenum (Mo), aluminum (Al), titanium (Ti), manganese (Mn), and an alloy. In an embodiment, the gate metal pattern 303 may have a multilayer structure having a plurality of metal layers including materials different from each other. The gate metal pattern 303 may include the gate line GL of FIG. 1. In an embodiment, the gate metal pattern 303 may include a gate electrode of the thin film transistor in the pixel 120 of FIG. 1.

The gate insulating layer 305 is disposed on the gate metal pattern 303 and the base substrate 301. The gate insulating layer 305 may include an inorganic insulating material. For example, the gate insulation layer 305 may include silicon oxide (SiOx) and/or silicon nitride (SiNx). For example, the gate insulation layer 305 may include silicon oxide (SiOx), and may have a thickness of about 500 Å. In an embodiment, the gate insulation layer 305 may include a plurality of layers including materials different from each other. In an embodiment, the gate insulating layer 305 may include an active layer (not shown) including an oxide semiconductor.

The semiconductor layer 307 is disposed on the gate insulating layer 305. The semiconductor layer 307 may include a semiconductor member disposed in the peripheral area PA. The semiconductor layer 307 overlaps the data metal pattern 313 along the line I-I' of FIG. 3. The semiconductor layer 307 has a first thickness. The semiconductor layer 307 may include a metal material.

The first passivation layer 309 is disposed on the semiconductor layer 307. The first passivation layer 309 may be disposed on a portion of the semiconductor layer 307.

The first insulating layer 311 is disposed on the first passivation layer 309. The first insulating layer 311 may include an organic material. For example, the first insulating layer 311 may be a color filter layer. The color filter layer may include at least one of a red color filter layer, a green color filter layer, a blue color filter layer, and a white color filter layer.

The data metal pattern 313 is disposed on the semiconductor layer 307 and the first insulating layer 311. The data metal pattern 313 is disposed in the peripheral area PA. The data metal pattern 313 may include the data line DL of FIG. 1. In an embodiment, the data metal pattern 313 may include a source electrode and a drain electrode of a thin film transistor in a pixel 120 of FIG. 1. The data metal pattern 313 is an element different from the semiconductor layer 307. The data metal pattern 313 may include a first portion (or data metal member) directly contacting the semiconductor layer 307, and may include a second portion spaced from the semiconductor layer 307 by the first insulating layer 311. The data metal pattern 313 has a second thickness. In an embodiment, the second thickness (or the maximum thickness) of (the data metal member of) the data metal pattern 313 in a direction perpendicular to the base substrate 301 is thicker than the first thickness (or the maximum thickness) of (the semiconductor member of) the semiconductor layer 307 in the direction perpendicular to the base substrate 301. Therefore, a cross-section of the data metal pattern 313 may be sufficiently large, such that a resistance of the data metal pattern 313 is sufficiently low, and thus a charge rate of a pixel voltage charged in a pixel electrode of the pixel 120 through the data line DL in the data metal pattern 313 may be sufficiently high.

The second passivation layer 315 is disposed on the data metal pattern 313 and the first insulating layer 311.

The second insulating layer 317 is disposed on the second passivation layer 315. The second insulating layer 317 may include an organic material. For example, the second insulating layer 317 may be a color filter layer. The color filter layer may include at least one of a red color filter layer, a green color filter layer, a blue color filter layer, and a white color filter layer. The second insulating layer 317 may substantially planarize an upper surface of the display substrate 300.

The connection electrode 319 is disposed on the second insulating layer 317. The connection electrode 319 is disposed in the peripheral area PA. The connection electrode 319 may include a material substantially the same as that of the pixel electrodes in the pixels 120 disposed on the display area DA. The connection electrode 319 may include a transparent conductive material. For example, the connection electrode 319 may include indium tin oxide (ITO) or indium zinc oxide (IZO). In an embodiment, the connection electrode 319 may include titanium (Ti) and/or molybdenum titanium (MoTi). The connection electrode 319 may make contact with the gate metal pattern 303 and the data metal pattern 313 through at least one of contact holes 318 and 320 formed through the second insulating layer 317, the second passivation layer 315, the first insulating layer 311, the first passivation layer 309, and the gate insulating layer 305. Thus, (the gate metal member of) the gate metal pattern 303 may be electrically connected to (the data metal member of) the data metal pattern 313 through the connection electrode 319.

The gate metal member of the gate metal pattern 303, the semiconductor member of the semiconductor layer 307, and the data metal member of the data metal pattern 313 may form the static electricity prevention circuit disposed in the fan out area FOA. For example, the members of the gate metal pattern 303, the semiconductor layer 307, and the data metal pattern 313 may form at least one of a static electricity prevention diode and a static electricity prevention transistor of the static electricity prevention circuit. In an embodiment, the members of the gate metal pattern 303, the semiconductor layer 307, and the data metal pattern 313 may form the gate driving part 130.

Figure 7A:
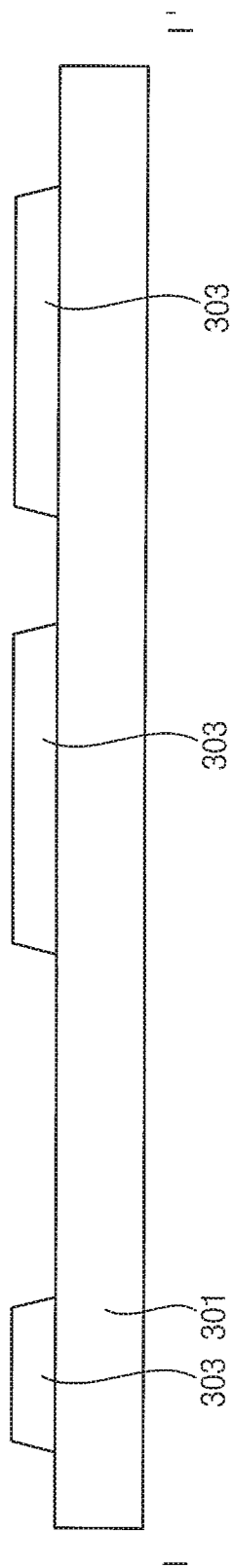

FIGS. 7A to 7O are cross-sectional views illustrating a method of manufacturing the display substrate 300 of FIGS. 2 to 6.

Figure 7B:
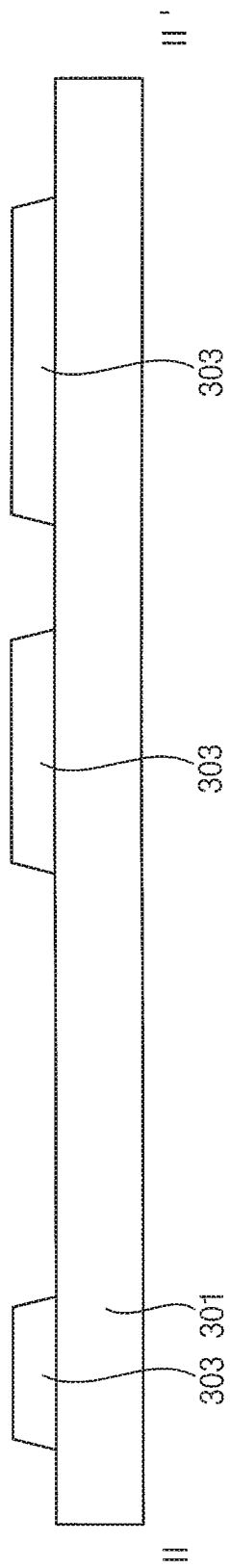

Referring to FIGS. 7A, 7B, and 7C, the gate metal pattern 303 is formed on the base substrate 301. The gate metal pattern 303 may include a gate metal member formed on the peripheral area PA of FIG. 1. The gate metal pattern 303 may have a single layer structure including at least one of copper (Cu), silver (Ag), chrome (Cr), molybdenum (Mo), aluminum (Al), titanium (Ti), manganese (Mn), and an alloy. In an embodiment, the gate metal pattern 303 may have a multi-layer structure having a plurality of metal layers including materials different from each other. The gate metal pattern 303 may include the gate line GL of FIG. 1. In an embodiment, the gate metal pattern 303 may include a gate electrode of the thin film transistor in the pixel 120 of FIG. 1.

Figure 7D:
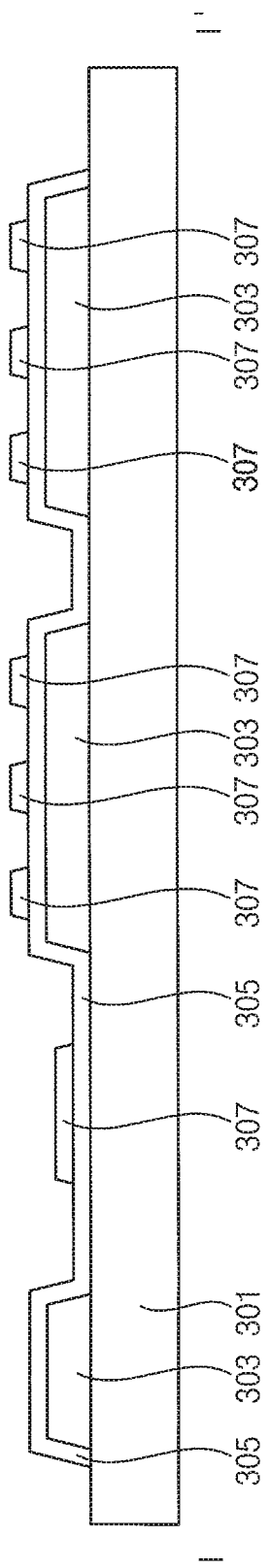
Figure 7E:
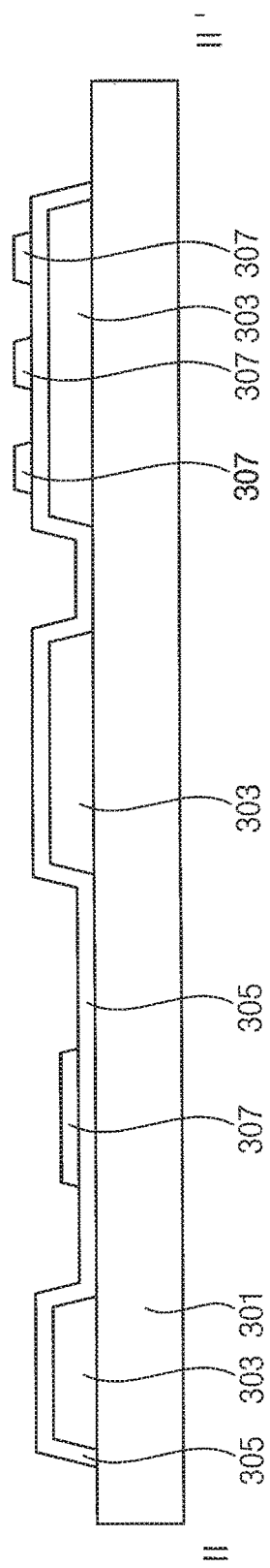
Figure 7F:
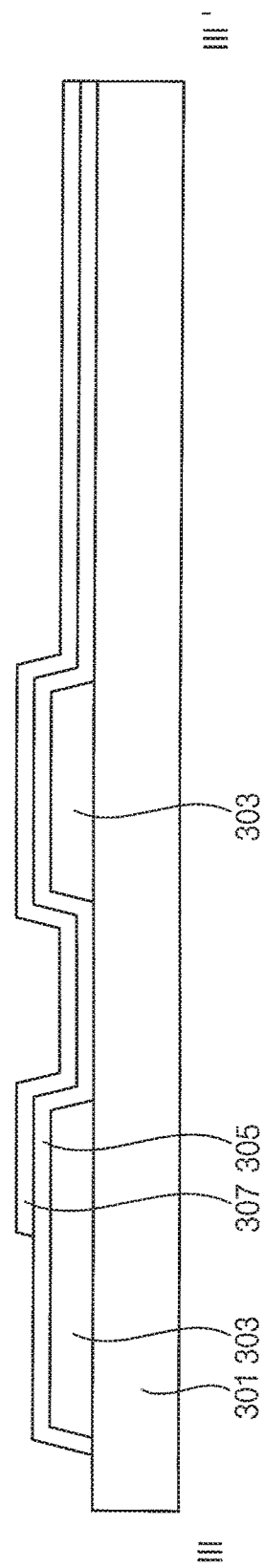
Figure 7G:
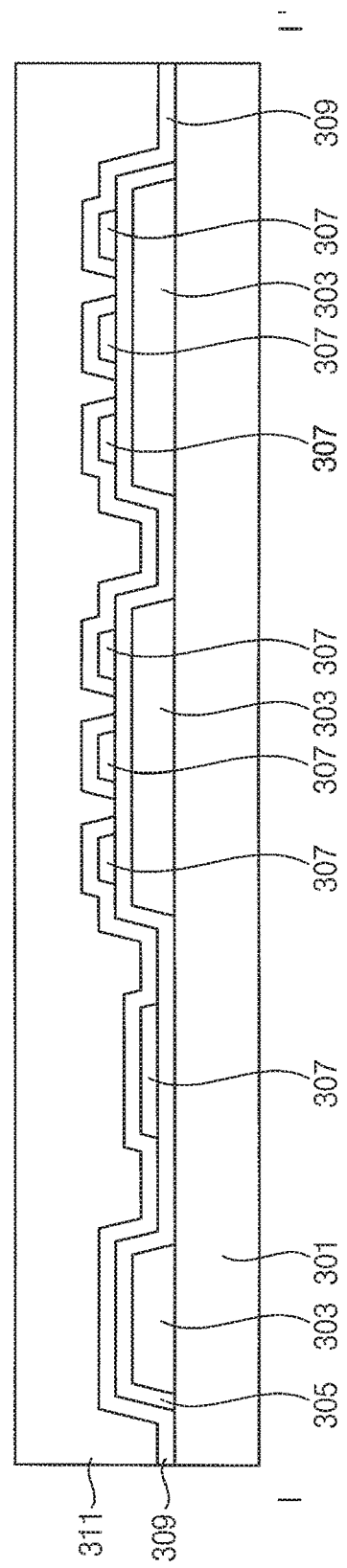

Referring to FIGS. 7D, 7E, and 7F, the gate insulating layer 305 is formed on the gate metal pattern 303 and the base substrate 301. The gate insulating layer 305 may include an inorganic insulating material. For example, the gate insulation layer 305 may include silicon oxide (SiOx) and/or silicon nitride (SiNx). For example, the gate insulation layer 305 may include silicon oxide (SiOx), and may have a thickness of about 500 Å. In an embodiment, the gate insulation layer 305 may include a plurality of layers including materials different from each other. In an embodiment, the gate insulating layer 305 may further include an active layer (not shown) including an oxide semiconductor.

In an embodiment, the semiconductor layer 307 is formed on the gate insulating layer 305. The semiconductor layer 307 is formed on the gate insulating layer 305 and may include a semiconductor member formed on the peripheral area PA of FIG. 1. The semiconductor layer 307 (or the semiconductor member) has the first thickness.

Figure 7H:
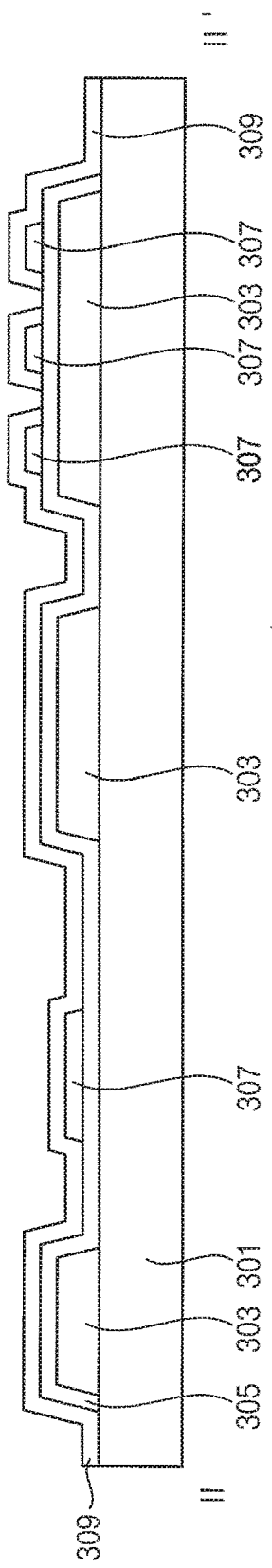
Figure 7I:
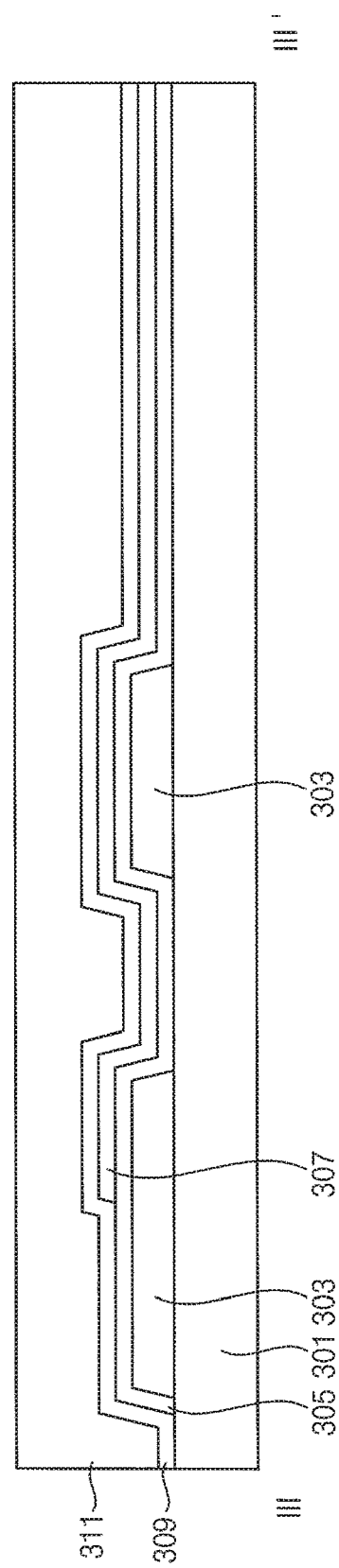

Referring to FIGS. 7Q 7H, and 7I, the first passivation layer 309 is formed on the semiconductor layer 307.

In an embodiment, the first insulating layer 311 is formed on the first passivation layer 309. The first insulating layer 311 may include an organic material. For example, the first insulating layer 311 may be a color filter layer. The color filter layer may include at least one of a red color filter layer, a green color filter layer, a blue color filter layer, and a white color filter layer.

Figure 7J:
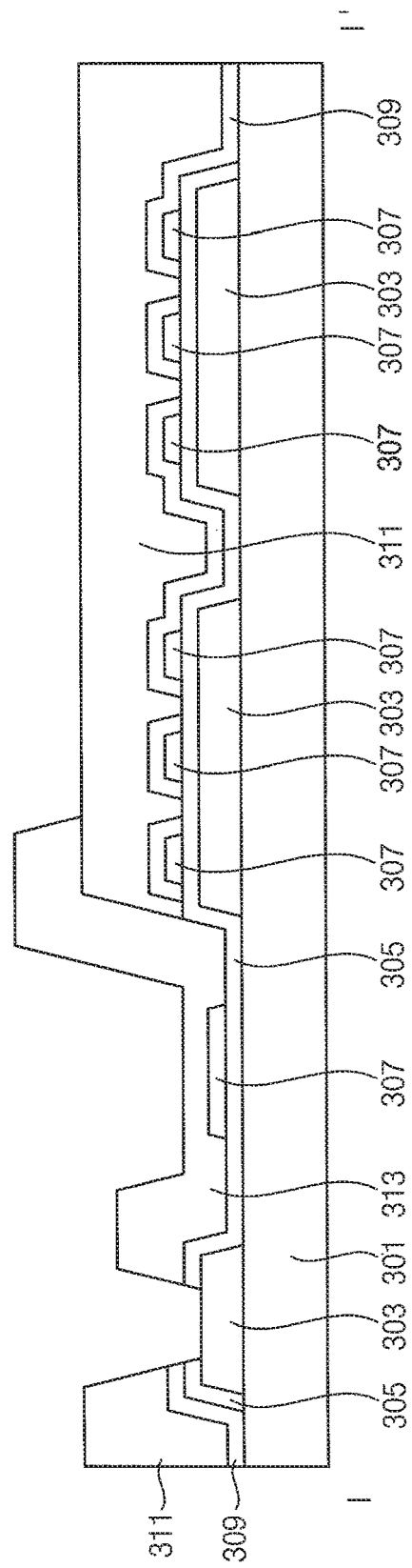
Figure 7K:
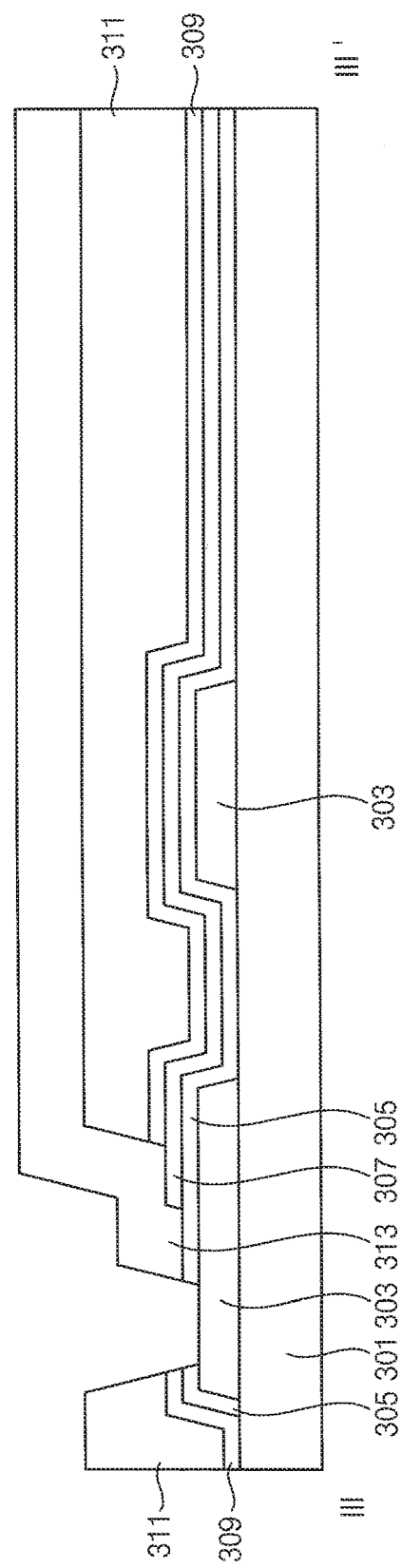

Referring to FIGS. 7J and 7K, the data metal pattern 313 is formed on the semiconductor layer 307 and the first insulating layer 311. The data metal pattern 313 is formed on the semiconductor layer 307 and the first insulating layer 311 and may include a data metal member formed on the peripheral area PA of FIG. 1. The data metal pattern 313 may include the data line DL of FIG. 1. In an embodiment, the data metal pattern 313 may include the source electrode and the drain electrode of the thin film transistor in the pixel 120 of FIG. 1. The data metal pattern 313 is an element different from the semiconductor layer 307. The data metal pattern 313 may include the first portion (or the data metal member) directly contacting (at least three faces of the semiconductor member of) the semiconductor layer 307, and may include the second portion spaced from the semiconductor layer 307 by the first insulating layer 311. The data metal pattern 313 has the second thickness. In an embodiment, the second thickness (or maximum thickness) of the data metal pattern 313 is thicker than the first thickness (or maximum thickness) of the semiconductor layer 307 in a direction perpendicular to the base substrate 301. Therefore, a resistance of the data metal pattern 313 is sufficiently low, and thus a charge rate of a pixel voltage charged in the pixel electrode of the pixel 120 through the data line DL in the data metal pattern 313 may be sufficiently high.

Figure 7L:
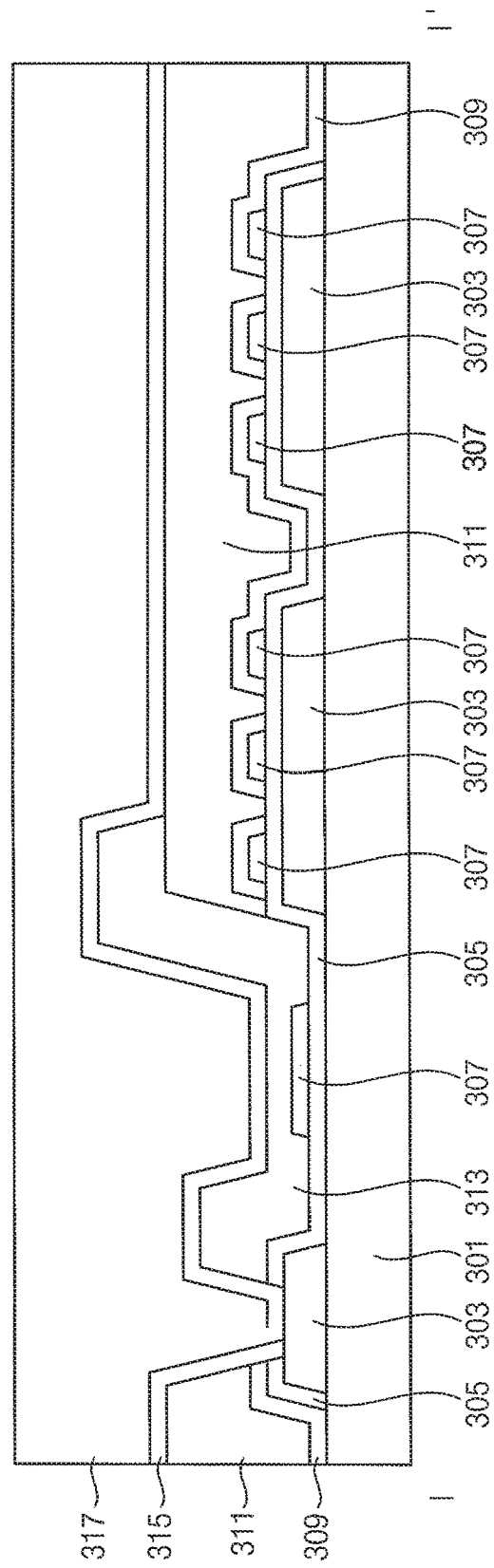
Figure 7M:
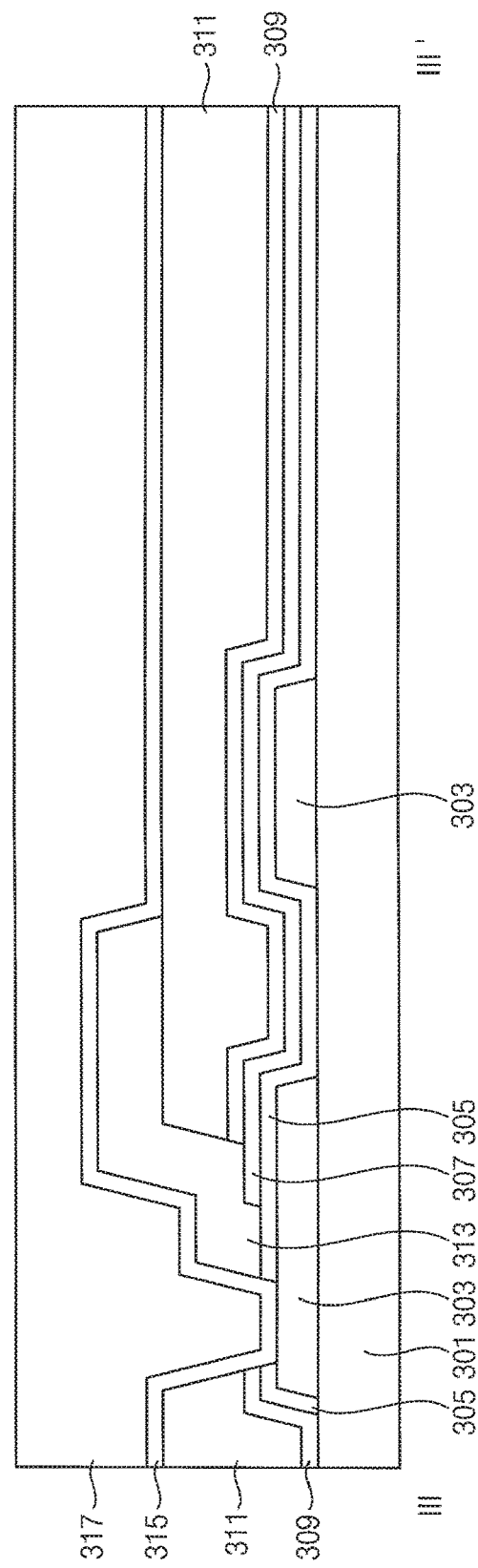

Referring to FIGS. 7L and 7M, the second passivation layer 315 is formed on the data metal pattern 313 and the first insulating layer 311.

In an embodiment, the second insulating layer 317 is formed on the second passivation layer 315. The second insulating layer 317 may include an organic material. For example, the second insulating layer 317 may be a color filter layer. The color filter layer may include at least one of a red color filter layer, a green color filter layer, a blue color filter layer, and a white color filter layer. The second insulating layer 317 may substantially planarize an upper surface of the display substrate 300.

Figure 7N:
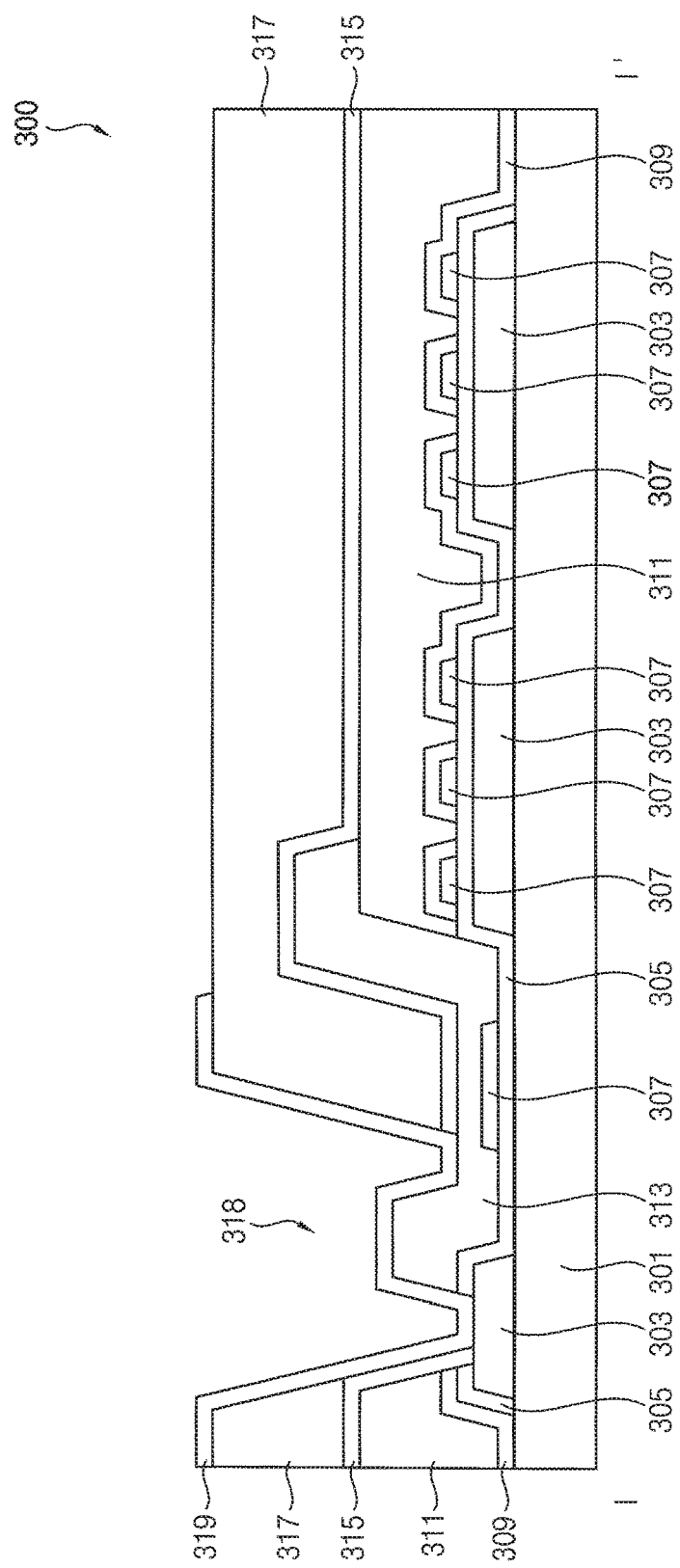
Figure 70:
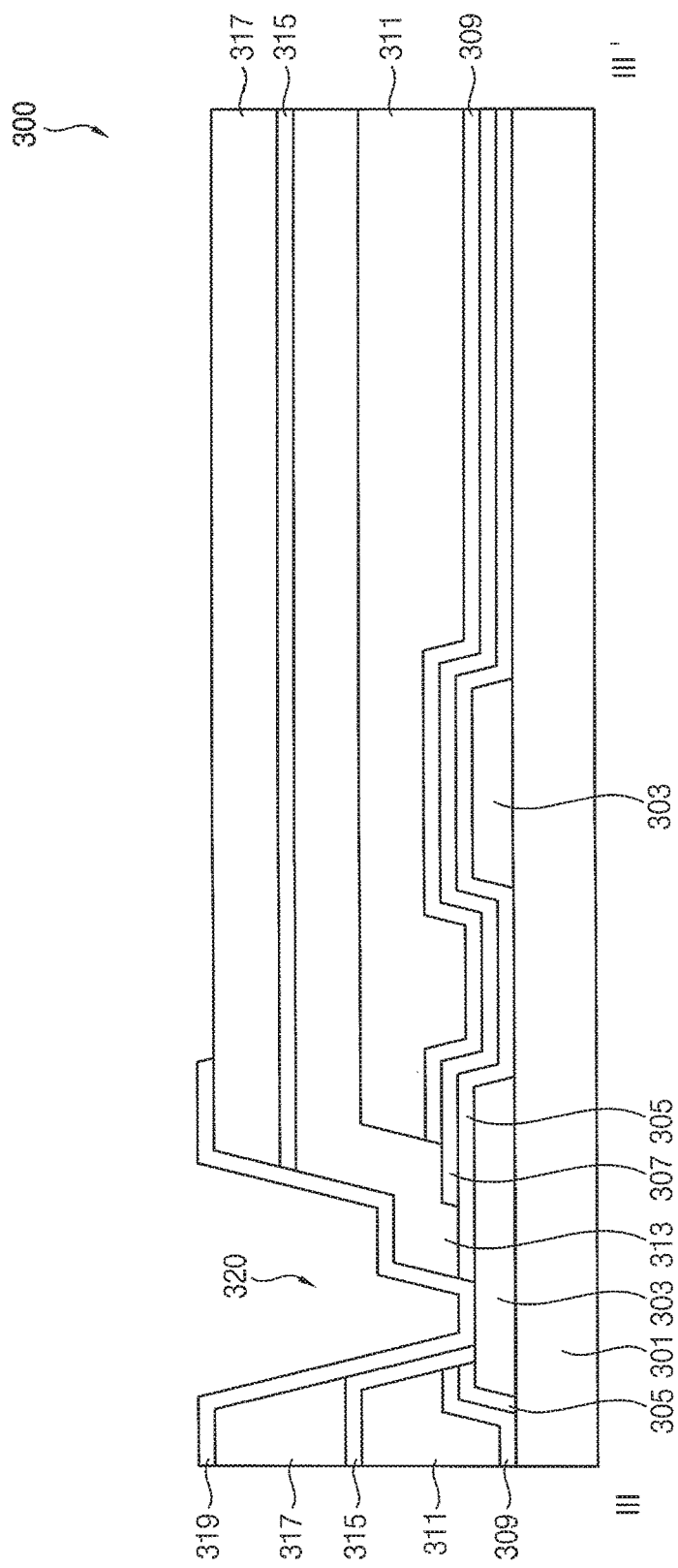

Referring to FIGS. 7N and 7O, the connection electrode 319 is formed on the second insulating layer 317. The connection electrode 319 is formed on the second insulating layer 317 and formed on the peripheral area PA of FIG. 1. The connection electrode 319 may include a material substantially the same as that of the pixel electrodes in at least some pixels 120 disposed in the display area DA. The connection electrode 319 may include a transparent conductive material. For example, the connection electrode 319 may include indium tin oxide (ITO) or indium zinc oxide (IZO). In an embodiment, the connection electrode 319 may include titanium (Ti) and/or molybdenum titanium (MoTi). The connection electrode 319 may directly contact the gate metal pattern 303 and the data metal pattern 313 through at least one of the contact holes 318 and 320 formed through the second insulating layer 317, the second passivation layer 315, the first insulating layer 311, the first passivation layer 309, and the gate insulating layer 305. Thus, the gate metal pattern 303 may be electrically connected to the data metal pattern 313 through the connection electrode 319.

According to the present embodiment, the second thickness (or maximum thickness) of the data metal pattern 313 is greater than the first thickness (or maximum thickness) of the semiconductor layer 307 in a direction perpendicular to the base substrate 301. Therefore, the resistance of the data metal pattern 313 is sufficiently low, and thus a charge rate of a pixel voltage charged in the pixel electrode of the pixel 120 through the data line DL in the data metal pattern 313 may be sufficiently high. Thus, image display quality of the display apparatus 100 may be satisfactory FIG. 8 is a cross-sectional view illustrating a display substrate 400 according to an embodiment.

The display substrate 400 is substantially the same as or analogous to the display substrate 300 except for a passivation layer 409, an insulating layer 411, a data metal pattern 413, and a connection electrode 419. The same reference numerals will be used to refer to same or like parts, and explanation concerning the above elements may not be repeated.

Figure 8:
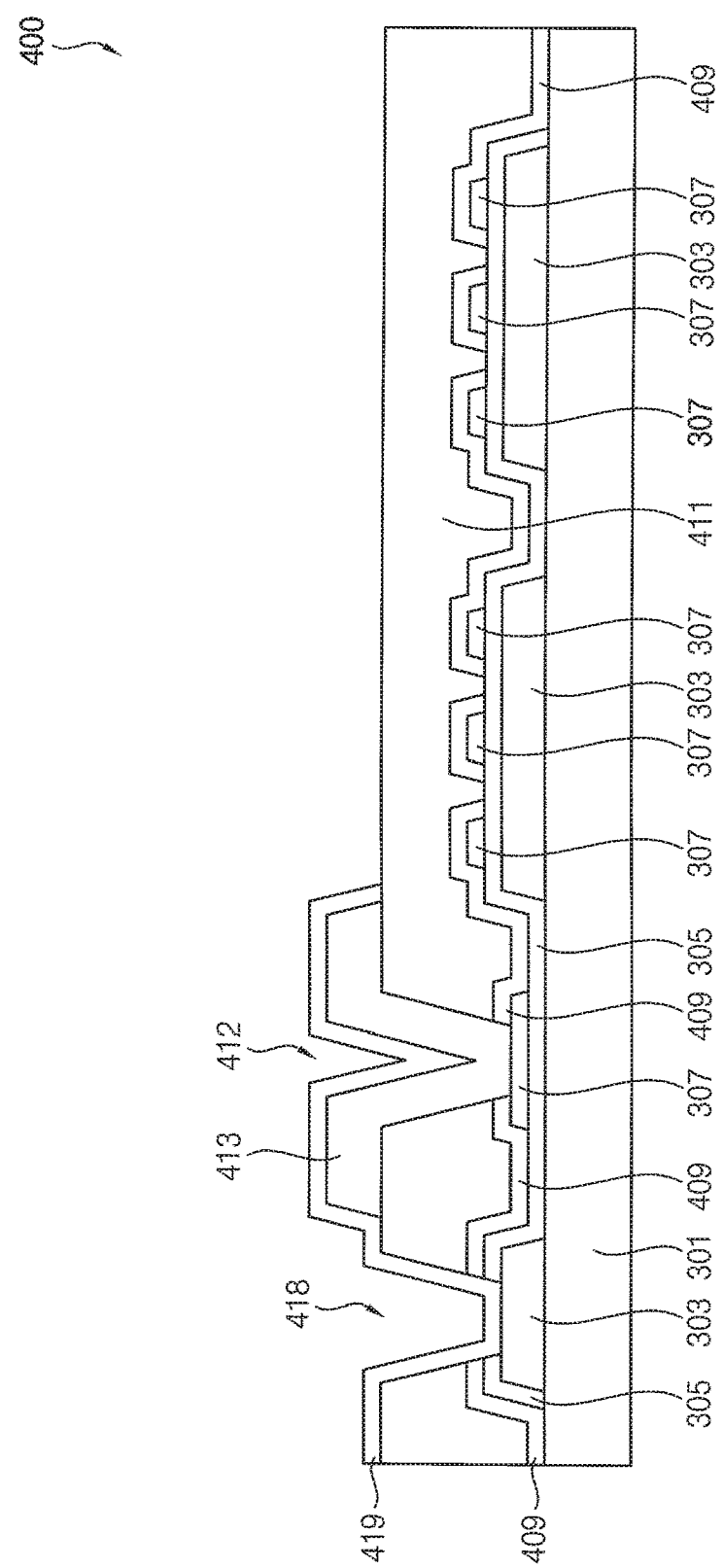
FIG. 8 is a cross-sectional view illustrating a display substrate structure according to an embodiment.

Referring to FIGS. 1 and 8, the display substrate 400 includes the base substrate 301, the gate metal pattern 303, the gate insulating layer 305, the semiconductor layer 307, the passivation layer 409, the insulating layer 411, the data metal pattern 413 and the connection electrode 419. The display substrate 400 may be in the display panel 110 of the display apparatus 100 illustrated in FIG. 1.

The base substrate 301 may be a glass substrate or a plastic substrate. The base substrate 301 may include a display area DA and a peripheral area PA.

The gate metal pattern 303 is disposed on the base substrate 301. The gate metal pattern 303 may include a gate metal member disposed in the peripheral area PA.

The gate insulating layer 305 is disposed on the gate metal pattern 303 and the base substrate 301. The gate insulating layer 305 may include an inorganic insulating material.

The semiconductor layer 307 is disposed on the gate insulating layer 305. The semiconductor layer 307 may include a semiconductor member disposed in the peripheral area PA. The semiconductor layer 307 (or the semiconductor member) has a first thickness.

The passivation layer 409 is disposed on the semiconductor layer 307. The passivation layer 409 may be disposed on a portion of the semiconductor layer 307.

The insulating layer 411 is disposed on the passivation layer 409. The insulating layer 411 may include an organic material. For example, the insulating layer 411 may be a color filter layer. When the insulating layer 411 is the color filter layer, the color filter layer may include at least one of a red color filter layer, a green color filter layer, a blue color filter layer and a white color filter layer. The insulating layer 411 may substantially planarize an upper surface of the display substrate 400.

The data metal pattern 413 is disposed on the semiconductor layer 307 and the insulating layer 411. The data metal pattern 413 may include a data metal member disposed in the peripheral area PA. The data metal pattern 413 may include the data line DL of FIG. 1. In an embodiment, the data metal pattern 413 may include a source electrode and a drain electrode of a thin film transistor in a pixel 120 of FIG. 1. The data metal pattern 413 is different from the semiconductor layer 307. The data metal pattern 413 may include a first portion (or data metal member) directly contacting (the semiconductor member of) the semiconductor layer 307, and may include a second portion spaced from the semiconductor layer 307 by the insulating layer 411. For example, the data metal pattern 413 may directly contact the semiconductor layer 307 through a contact hole 412 formed through the insulating layer 411 and the passivation layer 409. The data metal pattern 413 has a second thickness. In an embodiment, the second thickness (or maximum thickness) of the data metal pattern 413 is thicker than the first thickness (or maximum thickness) of the semiconductor layer 307 in a direction perpendicular to the base substrate 301. Therefore, a resistance of the data metal pattern 413 is sufficiently low, and thus a charge rate of a pixel voltage charged in a pixel electrode of the pixel 120 through the data line DL in the data metal pattern 413 may be sufficiently high.

The connection electrode 419 is disposed on the insulating layer 411. The connection electrode 419 is disposed in the peripheral area PA. The connection electrode 419 may include a material substantially the same as that of pixel electrodes in pixels 120 disposed in the display area DA. The connection electrode 419 may include a transparent conductive material. For example, the connection electrode 419 may include indium tin oxide (ITO) or indium zinc oxide (IZO). In an embodiment, the connection electrode 419 may include titanium (Ti) and/or molybdenum titanium (MoTi). The connection electrode 419 may directly contact (the gate metal member of) the gate metal pattern 303 through a contact hole 418 formed through the insulating layer 411, the passivation layer 409, and the gate insulating layer 305. In an embodiment, the connection electrode 419 may be disposed on the data metal pattern 413. Thus, (the gate metal member of) the gate metal pattern 303 may be electrically connected to (the data metal member of) the data metal pattern 413 through the connection electrode 419.

Figure 9A:
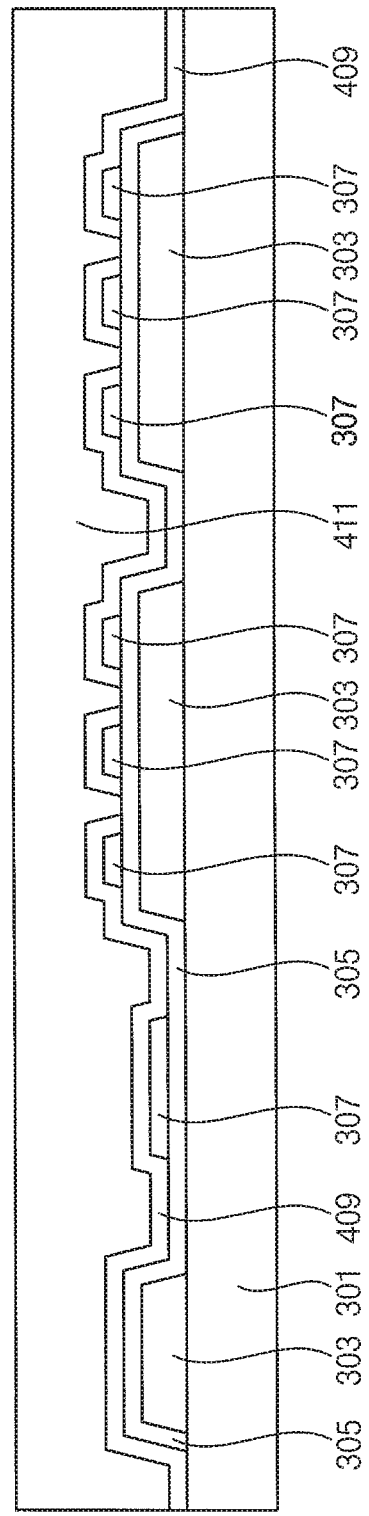
FIG. 9A, FIG. 9B, and FIG. 9C are cross-sectional views illustrating a method of manufacturing the display substrate of FIG. 8 according to an embodiment.
Figure 9B:
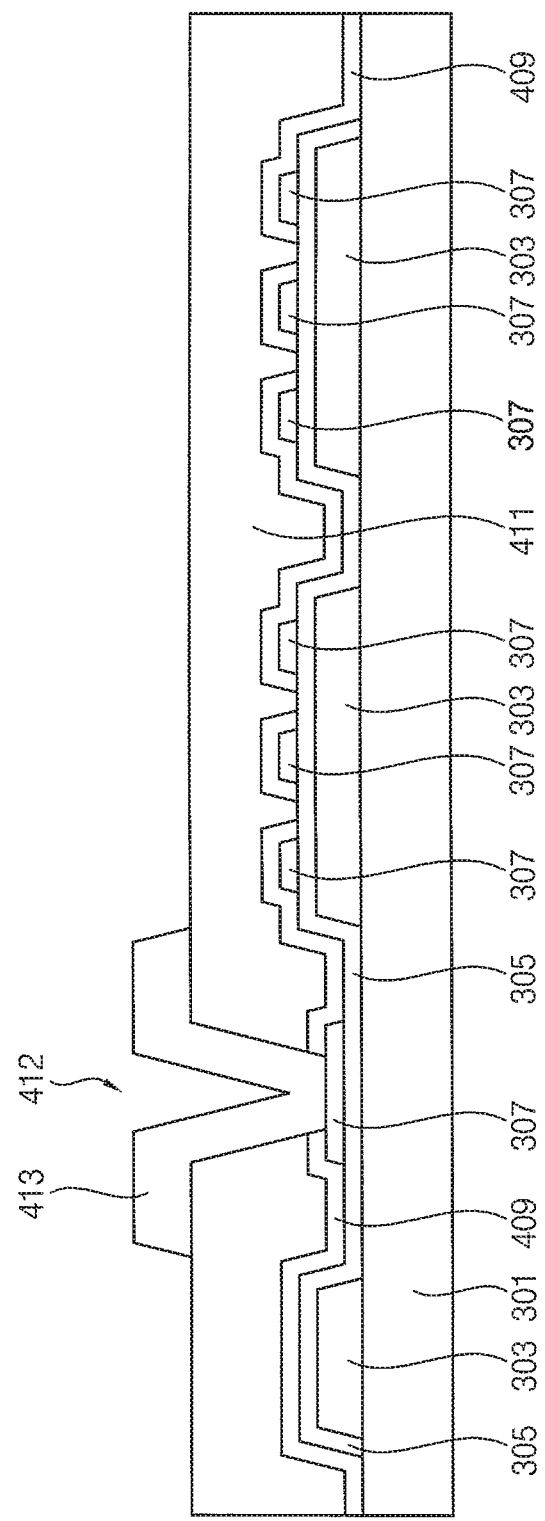
Figure 9C:
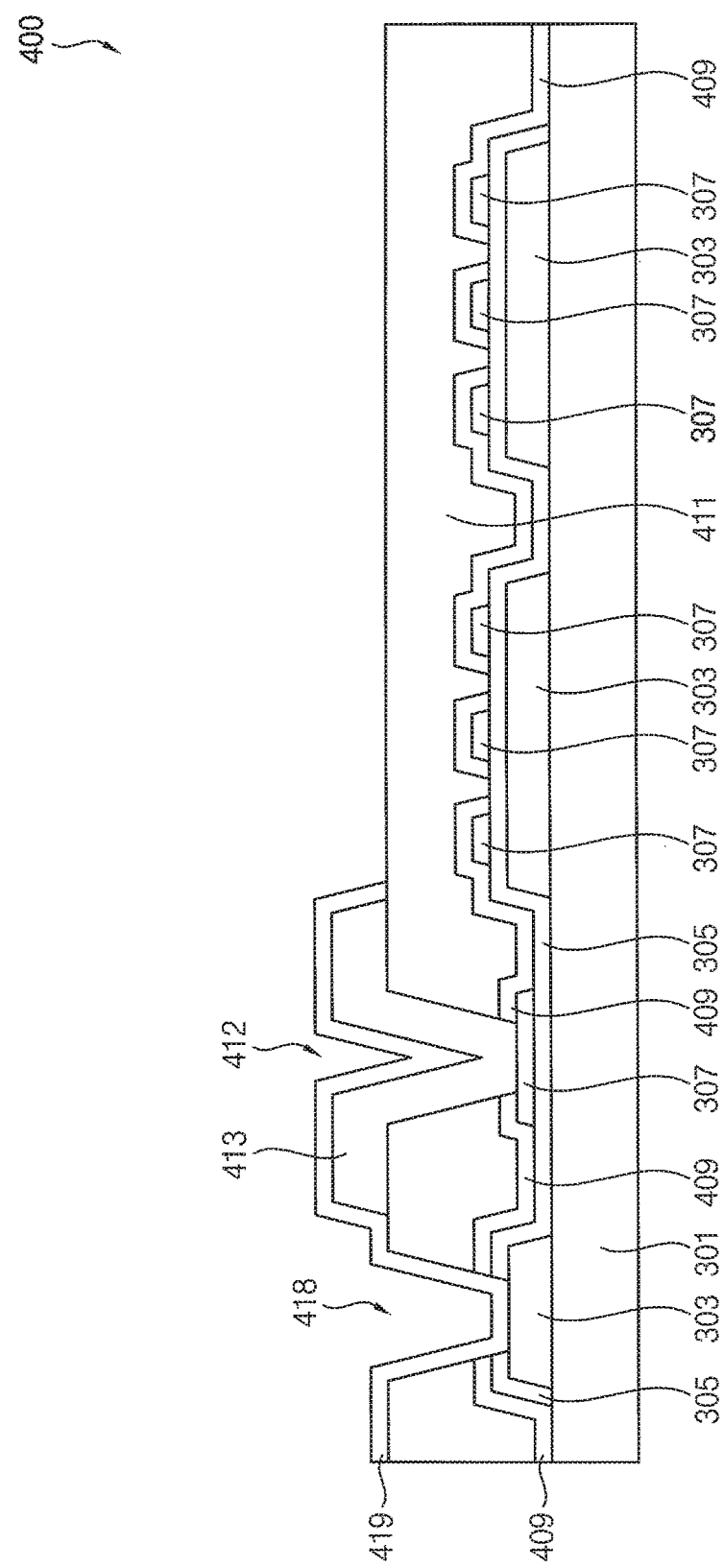

FIGS. 9A to 9C are cross-sectional views illustrating a method of manufacturing the display substrate 400 of FIG. 8.

Referring to FIG. 9A, the gate metal pattern 303 is formed on the base substrate 301. The gate metal pattern 303 may include a gate metal member formed on the peripheral area PA of FIG. 1.

In an embodiment, the gate insulating layer 305 is formed on the gate metal pattern 303 and the base substrate 301.

In an embodiment, the semiconductor layer 307 is formed on the gate insulating layer 305. The semiconductor layer 307 is formed on the gate insulating layer 305 and may include a semiconductor member formed on the peripheral area PA. The semiconductor layer 307 has the first thickness.

In an embodiment, the passivation layer 409 is formed on the semiconductor layer 307. In an embodiment, the insulating layer 411 is formed on the passivation layer 409. The insulating layer 411 may include an organic material.

Referring to FIG. 9B, the data metal pattern 413 is formed on the semiconductor layer 307 and the insulating layer 411. The data metal pattern 413 is formed on the semiconductor layer 307 and the insulating layer 411 and may include a data metal member formed on the peripheral area PA of FIG. 1. The data metal pattern 413 may include the data line DL of FIG. 1. In an embodiment, the data metal pattern 413 may include a source electrode and a drain electrode of a thin film transistor in a pixel 120 of FIG. 1. The data metal pattern 413 is different from the semiconductor layer 307. The data metal pattern 413 may include a first portion (e.g., the data metal member) directly contacting (the semiconductor member of) the semiconductor layer 307, and may include a second portion spaced from the semiconductor layer 307 by the insulating layer 411. For example, the data metal pattern 413 may directly contact the semiconductor layer 307 through the contact hole 412 formed through the insulating layer 411 and the passivation layer 409. The data metal pattern 413 has the second thickness. In an embodiment, in direction perpendicular to the base substrate 301, the second thickness (or maximum thickness) of the data metal pattern 413 is thicker than the first thickness (or maximum thickness) of the semiconductor layer 307. Therefore, a resistance of the data metal pattern 413 is comparatively low, and thus a charge rate of a pixel voltage charged in a pixel electrode of the pixel 120 through the data line DL in the data metal pattern 413 may be improved.

Referring to FIG. 9C, the connection electrode 419 is formed on the insulating layer 411. The connection electrode 419 is formed on the insulating layer 411 and is formed on the peripheral area PA of FIG. 1. The connection electrode 419 may include a material substantially the same as that of a pixel electrode in a pixel 120 disposed in the display area DA. The connection electrode 419 may include a transparent conductive material. For example, the connection electrode 419 may include indium tin oxide (ITO) or indium zinc oxide (IZO). In an embodiment, the connection electrode 419 may include titanium (Ti) and/or molybdenum titanium (MoTi). The connection electrode 419 may make contact with the gate metal pattern 303 through the contact hole 418 formed through the insulating layer 411, the passivation layer 409, and the gate insulating layer 305. In an embodiment, the connection electrode 419 may be disposed on the data metal pattern 413. Thus, the gate metal pattern 303 may be electrically connected to the data metal pattern 413 through the connection electrode 419.

According to an embodiment, in a direction perpendicular to the base substrate 301, the second thickness (or maximum thickness) of the data metal pattern 413 is greater than the first thickness (or maximum thickness) of the semiconductor layer 307. Therefore, the resistance of the data metal pattern 413 is sufficiently low, and thus a charge rate of a pixel voltage charged in the pixel electrode of the pixel 120 through the data line DL in the data metal pattern 413 may be sufficiently high. Thus, display quality of the display apparatus 100 may be satisfactory.

Figure 10:
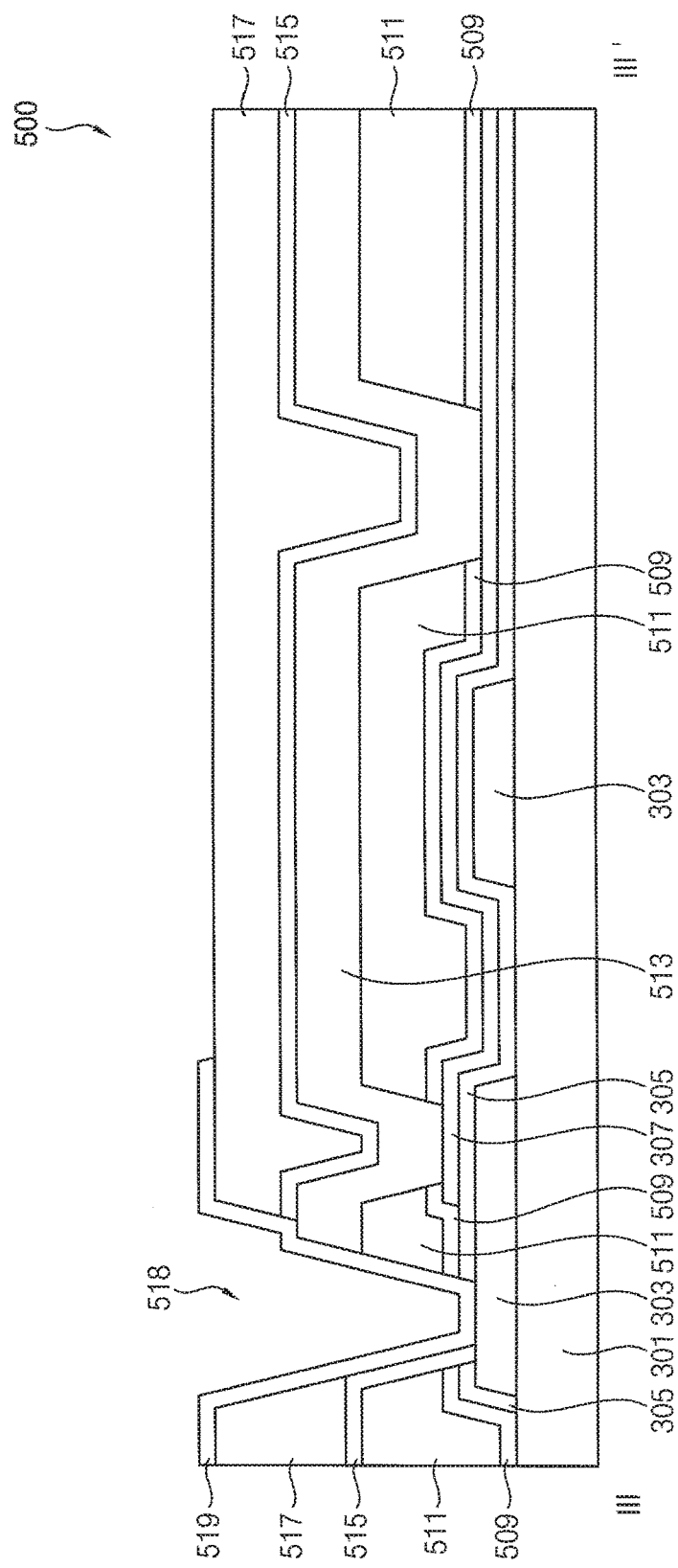
FIG. 10 is a cross-sectional view illustrating a display substrate structure according to an embodiment.

FIG. 10 is a cross-sectional view illustrating a display substrate 500 according to an embodiment.

The display substrate 500 is substantially the same as or analogous to the display substrate 300 illustrated in FIG. 6 except for a passivation layer 509, a first insulating layer 511, a data metal pattern 513, a second passivation layer 515, a second insulating layer 517 and a connection electrode 519. The same reference numerals will be used to refer to same or like parts, and explanation concerning the above elements may not be repeated.

FIG. 10 is a cross-sectional view taken along the line III-III' of FIG. 3 according to an embodiment.

Referring to FIGS. 1, 3 and 10, the display substrate 500 includes the base substrate 301, the gate metal pattern 303, the gate insulating layer 305, the semiconductor layer 307, the first passivation layer 509, the first insulating layer 511, the data metal pattern 513, the second insulating layer 517, and the connection electrode 519.

The base substrate 301 may be a glass substrate or a plastic substrate. The base substrate 301 may include a display area DA and a peripheral area PA.

The gate metal pattern 303 is disposed on the base substrate 301. The gate metal pattern may include a gate metal member disposed in the peripheral area PA.

The gate insulating layer 305 is disposed on the gate metal pattern 303 and the base substrate 301. The gate insulating layer 305 may include an inorganic insulating material.

The semiconductor layer 307 is disposed on the gate insulating layer 305. The semiconductor layer 307 may include a semiconductor member disposed in the peripheral area PA. The semiconductor layer 307 has a first thickness.

The first passivation layer 509 is disposed on the semiconductor layer 307. The first passivation layer 309 may be disposed on a portion of the semiconductor layer 307.

The first insulating layer 511 is disposed on the first passivation layer 509. The first insulating layer 511 may include an organic material. For example, the first insulating layer 511 may be a color filter layer. The color filter layer may include at least one of a red color filter layer, a green color filter layer, a blue color filter layer, and a white color filter layer.

The data metal pattern 513 is disposed on the semiconductor layer 307 and the first insulating layer 511. The data metal pattern 513 may include a data metal member disposed in the peripheral area PA. The data metal pattern 513 may include the data line DL of FIG. 1. In an embodiment, the data metal pattern 513 may include a source electrode and a drain electrode of a thin film transistor in a pixel 120 of FIG. 1. The data metal pattern 513 is different from the semiconductor layer 307. The data metal pattern 513 may include a first portion (e.g., the data metal member) directly contacting (the semiconductor member of) the semiconductor layer 307, and may include a second portion spaced from the semiconductor layer 307 by the first insulating layer 511. The data metal pattern 513 has a second thickness. In an embodiment, in a direction perpendicular to the base substrate 301, the second thickness (or maximum thickness) of the data metal pattern 513 is thicker than the first thickness (or maximum thickness) of the semiconductor layer 307. Therefore, a resistance of the data metal pattern 513 is sufficiently low, and thus a charge rate of a pixel voltage charged in a pixel electrode of the pixel 120 through the data line DL in the data metal pattern 513 may be sufficiently high.

The data metal pattern 513 may directly contact the semiconductor layer 307 through the first insulating layer 511 and the first passivation layer 509. Through multiple separate contact holes, the data metal pattern 513 may directly contact multiple portions of the semiconductor layer 307 that are spaced from one another. The data metal member may directly contact a first portion of the semiconductor member through a first contact hole. The data metal member may directly contact a second portion of the semiconductor member through a second contact hole spaced from the first contact hole. The first portion of the semiconductor member may be disposed closer to the base substrate 301 than the second portion of the semiconductor member. Therefore, potential resistance increase of the semiconductor layer 307 due to a thickness decrease of the semiconductor layer 307 may be prevented.

The second passivation layer 515 is disposed on the data metal pattern 513 and the first insulating layer 511.

The second insulating layer 517 is disposed on the second passivation layer 515. The second insulating layer 517 may include an organic material. For example, the second insulating layer 517 may be a color filter layer. The color filter layer may include at least one of a red color filter layer, a green color filter layer, a blue color filter layer, and a white color filter layer. The second insulating layer 517 may substantially planarize an upper surface of the display substrate 500.

The connection electrode 519 is disposed on the second insulating layer 517. The connection electrode 519 is disposed in the peripheral area PA. The connection electrode 519 may include a material substantially the same as that of a pixel electrode in a pixel 120 disposed in the display area DA. The connection electrode 519 may include a transparent conductive material. For example, the connection electrode 519 may include indium tin oxide (ITO) or indium zinc oxide (IZO). In an embodiment, the connection electrode 519 may include titanium (Ti) and/or molybdenum titanium (MoTi). The connection electrode 519 may make contact with the gate metal pattern 303 and the data metal pattern 513 through a contact hole 518 formed through the second insulating layer 517, the second passivation layer 515, the first insulating layer 511, the first passivation layer 509, and the gate insulating layer 305. Thus, the gate metal pattern 303 may be electrically connected to the data metal pattern 513 through the connection electrode 519.

FIGS. 11A to 11E are cross-sectional views illustrating a method of manufacturing the display substrate 500 of FIG. 10.

Figure 11A:
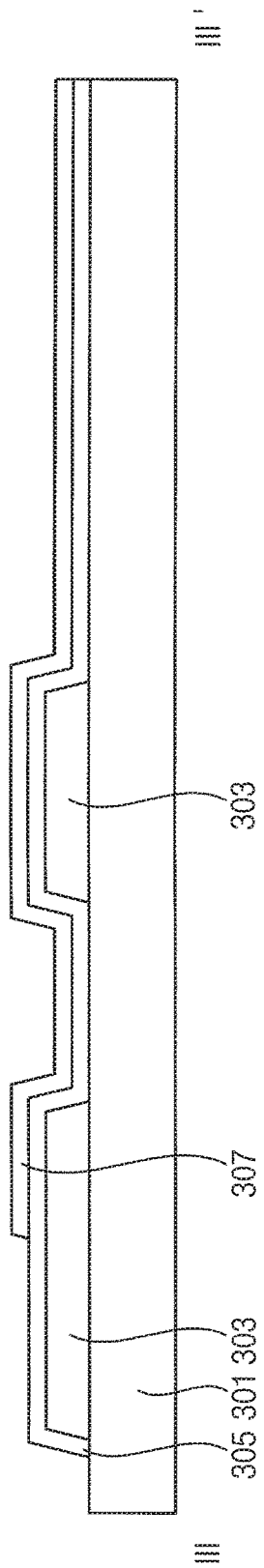
FIG. 11A, FIG. 11B, FIG. 11C, FIG. 11D, and FIG. 11E are cross-sectional views illustrating a method of manufacturing the display substrate structure of FIG. 10 according to an embodiment.

Referring to FIG. 11A, the gate metal pattern 303 is formed on the base substrate 301. The gate metal pattern 303 may include a gate metal member formed on the base substrate 301 and formed on the peripheral area PA of FIG. 1.

In an embodiment, the gate insulating layer 305 is formed on the gate metal pattern 303 and the base substrate 301. The gate insulating layer 305 may include an inorganic insulating material.

In an embodiment, the semiconductor layer 307 is formed on the gate insulating layer 305. The semiconductor layer 307 is formed on the gate insulating layer 305 and may include a semiconductor member formed on the peripheral area PA of FIG. 1. The semiconductor layer 307 has the first thickness.

Figure 11B:
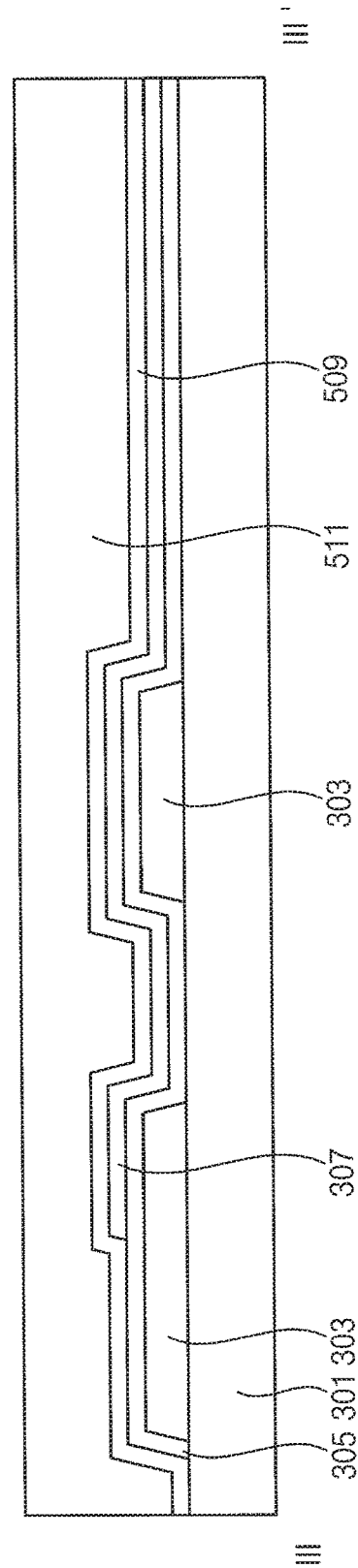

Referring to FIG. 11B, the first passivation layer 509 is formed on the semiconductor layer 307.

In an embodiment, the first insulating layer 511 is formed on the first passivation layer 509. The first insulating layer 511 may include an organic material. For example, the first insulating layer 511 may be a color filter layer. The color filter layer may include at least one of a red color filter layer, a green color filter layer, a blue color filter layer, and a white color filter layer.

Figure 11C:
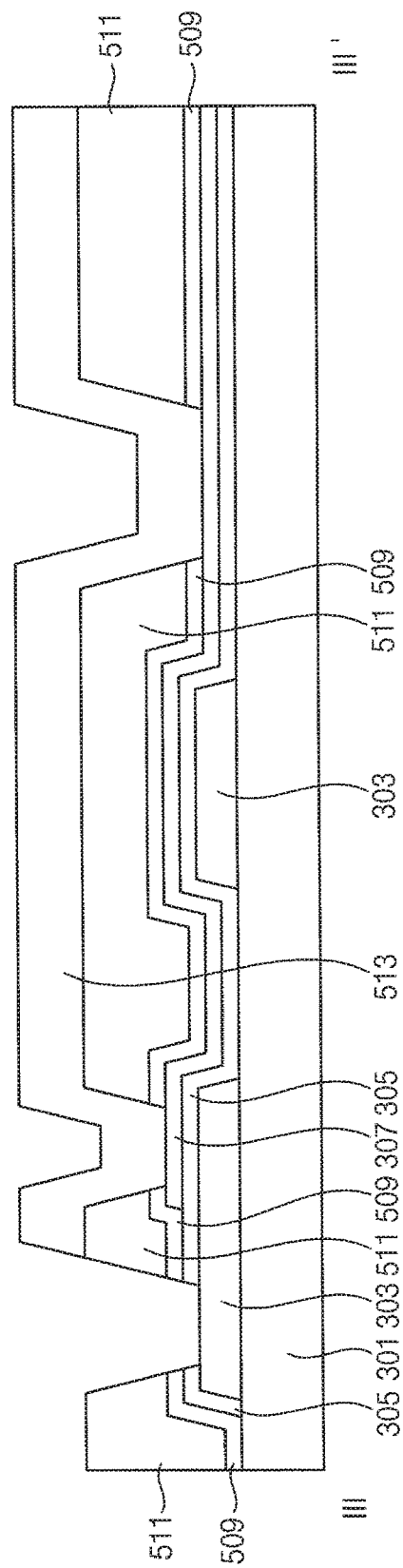

Referring to FIG. 11C, the data metal pattern 513 is formed on the semiconductor layer 507 and the first insulating layer 511. The data metal pattern 513 is formed on the semiconductor layer 507 and the first insulating layer 511 and may include a data metal member formed on the peripheral area PA of FIG. 1. The data metal pattern 513 may include the data line DL of FIG. 1. In an embodiment, the data metal pattern 513 may include the source electrode and the drain electrode of the thin film transistor in the pixel 120 of FIG. 1. The data metal pattern 513 is an element different from the semiconductor layer 307. The data metal pattern 513 may include a first portion (e.g., the data metal member) directly contacting (the semiconductor member of) the semiconductor layer 307, and may include a second portion spaced from the semiconductor layer 307 by the first insulating layer 511. The data metal pattern 513 has the second thickness. In an embodiment, in a direction perpendicular to the base substrate 301, the second thickness (or maximum thickness) of the data metal pattern 513 is thicker than the first thickness (or maximum thickness) of the semiconductor layer 307. Therefore, a resistance of the data metal pattern 513 is sufficiently low, and thus a charge rate of a pixel voltage charged in the pixel electrode of the pixel 120 through the data line DL in the data metal pattern 513 may be sufficiently high.

The data metal pattern 513 may make contact with the semiconductor layer 307 through the first insulating layer 511 and the first passivation layer 509. Through multiple separate contact holes, the data metal pattern 513 may directly contact multiple separate portions of the semiconductor layer 307 that are spaced from the base substrate 301 by different distances. Therefore, potential resistance increase of the semiconductor layer 307 due to a thickness decrease of the semiconductor layer 307 may be prevented.

Figure 11D:
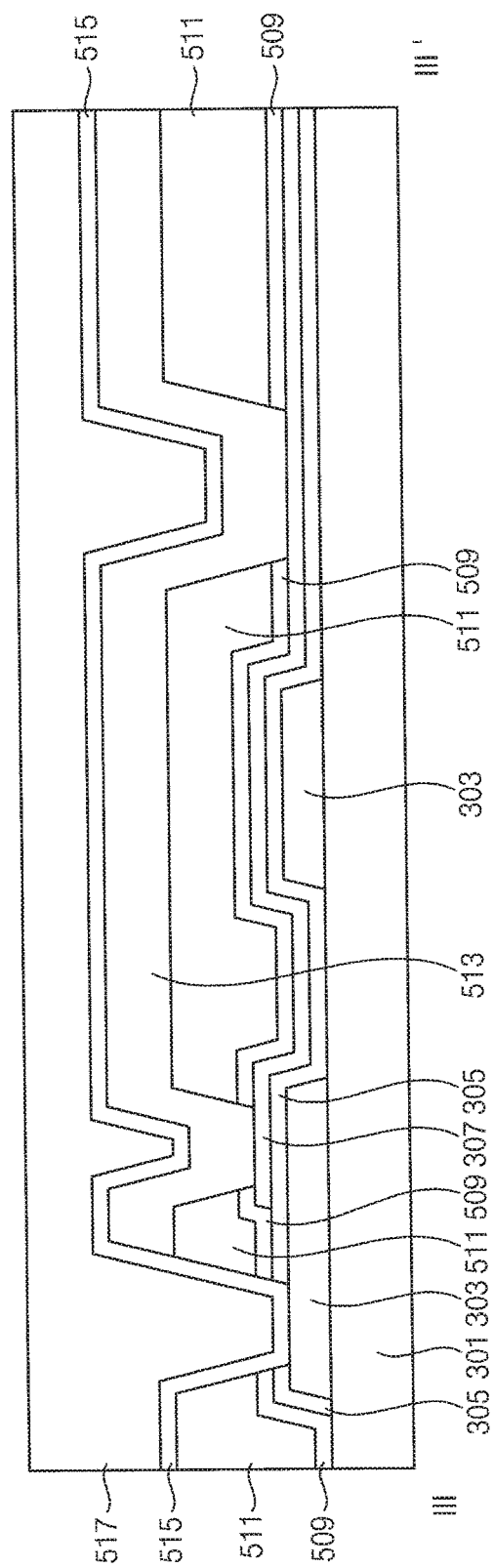

Referring to FIG. 11D, the second passivation layer 515 is formed on the data metal pattern 513 and the first insulating layer 511.

In an embodiment, the second insulating layer 317 is formed on the second passivation layer 315. The second insulating layer 517 may include an organic material. For example, the second insulating layer 517 may be a color filter layer. The color filter layer may include at least one of a red color filter layer, a green color filter layer, a blue color filter layer, and a white color filter layer. The second insulating layer 517 may substantially planarize an upper surface of the display substrate 500.

Figure 11E:
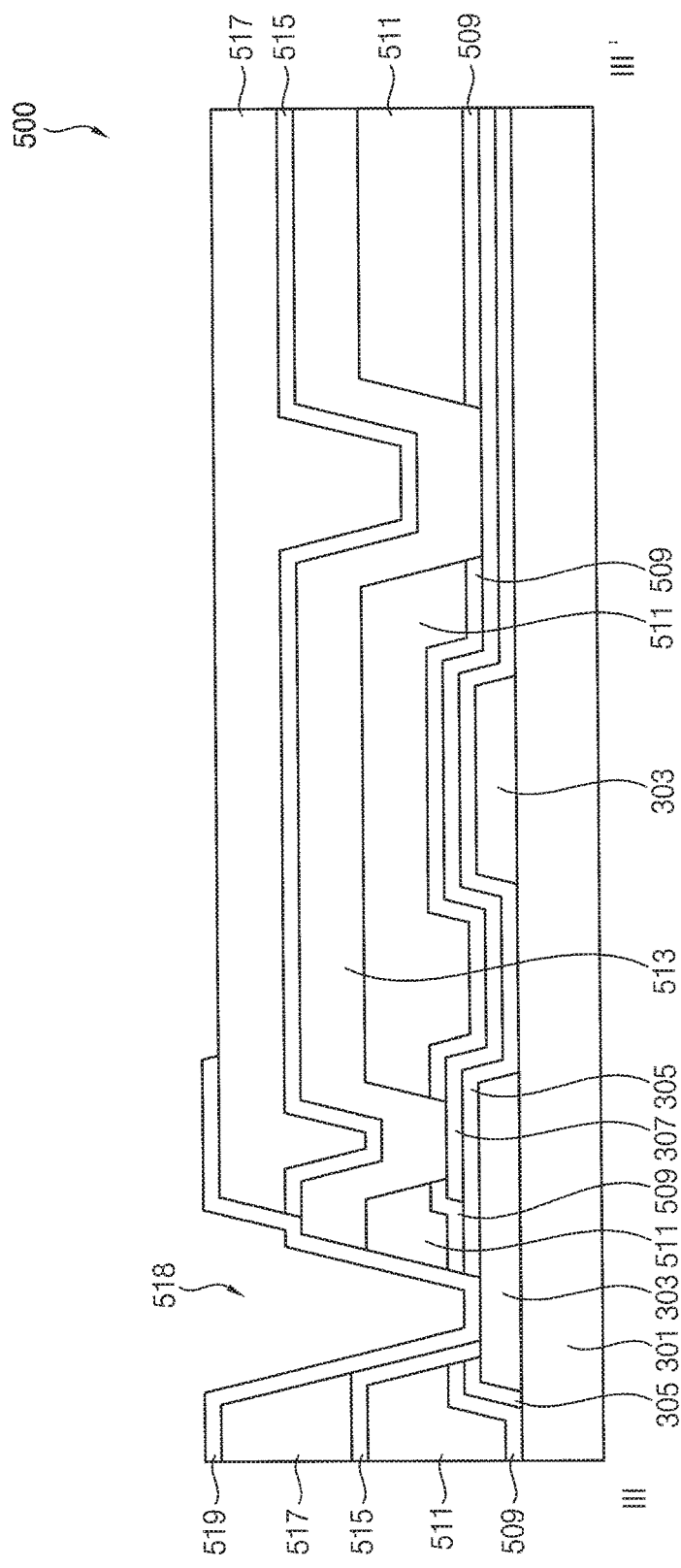

Referring to FIG. 11E, the connection electrode 519 is formed on the second insulating layer 517. The connection electrode 519 is formed on the second insulating layer 517 and formed on the peripheral area PA of FIG. 1. The connection electrode 519 may include a material substantially the same as that of the pixel electrode in the pixel 120 of the display area DA. Specifically, the connection electrode 519 may include a transparent conductive material. For example, the connection electrode 519 may include indium tin oxide (ITO) or indium zinc oxide (IZO). In an embodiment, the connection electrode 519 may include titanium (Ti) and/or molybdenum titanium (MoTi). The connection electrode 519 may make contact with the gate metal pattern 303 and the data metal pattern 513 through the contact holes 518 formed through the second insulating layer 517, the second passivation layer 515, the first insulating layer 511, the first passivation layer 509, and the gate insulating layer 305. Thus, the gate metal pattern 303 may be electrically connected to the data metal pattern 513 through the connection electrode 519.

According to an embodiment, in a direction perpendicular to the base substrate 301, the second thickness (or maximum thickness) of the data metal pattern 513 is greater than the first thickness (or maximum thickness) of the semiconductor layer 307. Therefore, the resistance of the data metal pattern 313 is sufficiently low.

In an embodiment, through multiple separate contact holes, the data metal pattern 513 may directly contact multiple separate portions of the semiconductor layer 307. The multiple separate portions of the semiconductor layer 307 may be spaced from the base substrate 301 by different distances. Therefore, potential resistance increase of the semiconductor layer 307 due to a thickness decrease of the semiconductor layer 307 may be prevented.

Therefore, a charge rate of a pixel voltage charged in the pixel electrode of the pixel 120 through the data line DL in the data metal pattern 513 and a channel layer of the thin film transistor 121 in the semiconductor layer 307 may sufficiently high. Thus, image display quality of the display apparatus 100 may satisfactory.

FIG. 12 is a plan view illustrating a peripheral area of a display substrate in which a gate driving part is disposed according to an embodiment. FIG. 13 is a cross-sectional view taken along a line IV-IV' of FIG. 12.

The display substrate 600 in which the gate driving part 630 is disposed is substantially the same as or analogous to the display substrate 300 in which the gate driving part 130 is disposed illustrated in FIGS. 3 and 6 except for a passivation layer 609, an insulating layer 611, and a data metal pattern 613. The same reference numerals will be used to refer to same or like parts, and explanation concerning the above elements may not be repeated.

Referring to FIGS. 1, 12, and 13, the display substrate 600 includes the base substrate 301, the gate metal pattern 303, the gate insulating layer 305, the semiconductor layer 307, the passivation layer 609, the insulating layer 611, and the data metal pattern 613.

The base substrate 301 may be a glass substrate or a plastic substrate. The base substrate 301 may include a display area DA and a peripheral area PA.

The gate metal pattern 303 is disposed on the base substrate 301 and may include a gate metal member disposed on the peripheral area PA. The gate insulating layer 305 may include an inorganic insulating material.

The gate insulating layer 305 is disposed on the gate metal pattern 303 and the base substrate 301. The gate insulating layer 305 may include an inorganic material.

The semiconductor layer 307 is disposed on the gate insulating layer 305. The semiconductor layer 307 may include a semiconductor member disposed in the peripheral area PA. The semiconductor layer 307 has a first thickness.

The passivation layer 609 is disposed on the semiconductor layer 307. The passivation layer 609 may be disposed on a portion of the semiconductor layer 307.

The insulating layer 611 is disposed on the passivation layer 609. The insulating layer 611 may include an organic material. For example, the insulating layer 611 may be a color filter layer. The color filter layer may include at least one of a red color filter layer, a green color filter layer, a blue color filter layer, and a white color filter layer.

The data metal pattern 613 is disposed on the semiconductor layer 307, the insulating layer 611 and the gate metal pattern 303. The data metal pattern 613 may include a data metal member disposed in the peripheral area PA. The data metal pattern 613 may include the data line DL of FIG. 1. In an embodiment, the data metal pattern 613 may include a source electrode and a drain electrode of a thin film transistor in a pixel 120 of FIG. 1. The data metal pattern 613 is different from the semiconductor layer 307. The data metal pattern 613 may include a first portion (e.g., the data metal member) directly contacting the semiconductor layer 307, and may include a second portion spaced from the semiconductor layer 307 by the insulating layer 611. The data metal pattern 613 has a second thickness. In an embodiment, in a direction perpendicular to the base substrate 301 the second thickness (or maximum thickness) of the data metal pattern 613 is thicker than the first thickness (or maximum thickness) of the semiconductor layer 307. Therefore, a resistance of the data metal pattern 613 is sufficiently low, and thus a charge rate of a pixel voltage charged in a pixel electrode of the pixel 120 through the data line DL in the data metal pattern 613 may be sufficiently high.

The data metal pattern 613 may contact the gate metal pattern 303 directly. Specifically, (the data metal member of) the data metal pattern 613 may be electrically connected to (the gate metal member of) the gate metal pattern 303 directly without an additional connection electrode. The data metal pattern 613 may be connected to the gate metal pattern 303 through a contact hole 612 formed through the insulating layer 611, the passivation layer 609, and the gate insulating layer 305.

Figure 14A:
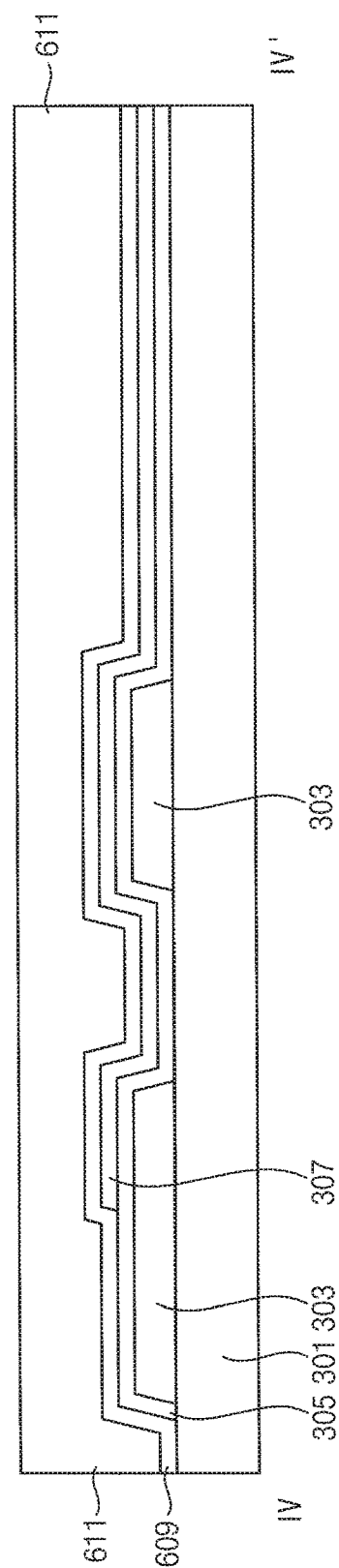
FIG. 14A and FIG. 14B are cross-sectional views illustrating a method of manufacturing the display substrate structure of FIG. 13 according to an embodiment.
Figure 14B:
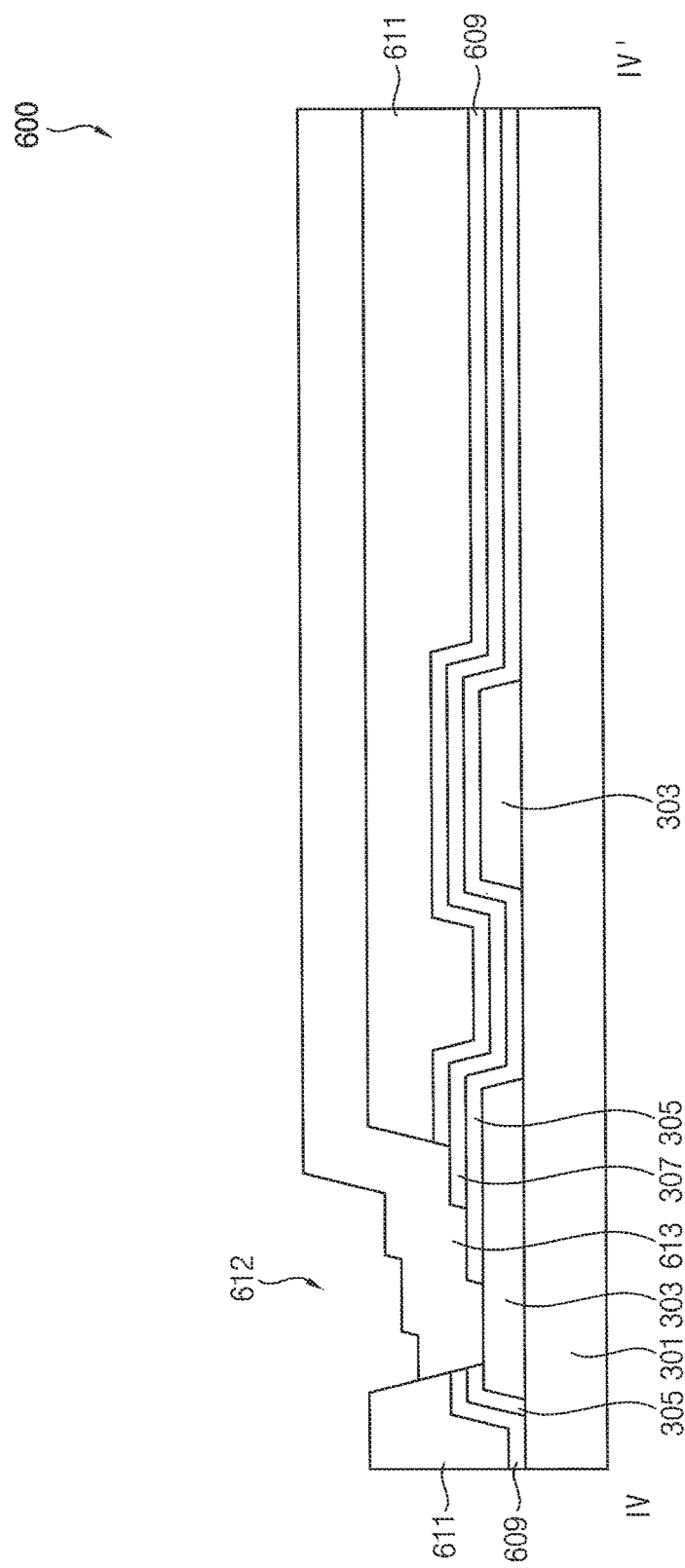

FIGS. 14A and 14B are cross-sectional views illustrating a method of manufacturing the display substrate 600 of FIG. 13.

Referring to FIG. 14A, the gate metal pattern 303 is formed on the base substrate 301. The gate metal pattern 303 is formed on the base substrate 301 and may include a gate metal member formed on the peripheral area PA of FIG. 1.

In an embodiment, the gate insulating layer 305 is formed on the gate metal pattern 303 and the base substrate 301. The gate insulating layer 305 may include an inorganic material.

In an embodiment, the semiconductor layer 307 is formed on the gate insulating layer 305. The semiconductor layer 307 is formed on the gate insulating layer 305 and may include a semiconductor member formed on the peripheral area PA of FIG. 1. The semiconductor layer 307 has the first thickness.

In an embodiment, the passivation layer 609 is formed on the semiconductor layer 307.

In an embodiment, the insulating layer 611 is formed on the passivation layer 609. The insulating layer 611 may include an organic material. For example, the insulating layer 611 may be a color filter layer. The color filter layer may include at least one of a red color filter layer, a green color filter layer, a blue color filter layer, and a white color filter layer.

Referring to FIG. 14B, the data metal pattern 613 is formed on the semiconductor layer 307, the insulating layer 611 and the gate metal pattern 303. The data metal pattern 613 is formed on the semiconductor layer 307, the insulating layer 611, and the gate metal pattern 303 and may include a semiconductor member formed on the peripheral area PA of FIG. 1. The data metal pattern 613 may include the data line DL of FIG. 1. In an embodiment, the data metal pattern 613 may include a source electrode and a drain electrode of the thin film transistor in the pixel 120 of FIG. 1. The data metal pattern 613 is different from the semiconductor layer 307. The data metal pattern 613 may include a first portion (e.g., the data metal member) directly contacting (the semiconductor member of) the semiconductor layer 307, and may include a second portion spaced from the semiconductor layer 307 by the insulating layer 611. The data metal pattern 613 has the second thickness. In an embodiment, in a direction perpendicular to the base substrate 301, the second thickness (or maximum thickness) of the data metal pattern 613 is thicker than the first thickness (or maximum thickness) of the semiconductor layer 307. Therefore, a resistance of the data metal pattern 613 is sufficiently low, and thus a charge rate of a pixel voltage charged in a pixel electrode of the pixel 120 through the data line DL in the data metal pattern 613 may be sufficiently high.

The data metal pattern 613 may contact the gate metal pattern 303 directly. Specifically, the data metal pattern 613 may be electrically connected to the gate metal pattern 303 directly without an additional connection electrode. The data metal pattern 613 may be connected to the gate metal pattern 303 through the contact hole 612 formed through the insulating layer 611, the passivation layer 609, and the gate insulating layer 305.

According to an embodiment, in a direction perpendicular to the base substrate 301, the second thickness (or maximum thickness) of the data metal pattern 613 is greater than the first thickness (or maximum thickness) of the semiconductor layer 307. Therefore, the resistance of the data metal pattern 613 is sufficiently low, and thus a charge rate of a pixel voltage charged in the pixel electrode of the pixel 120 through the data line DL in the data metal pattern 613 may be improved. Thus, display quality of the display apparatus 100 may be sufficiently high.

In an embodiment, the data metal pattern 613 is directly connected to the gate metal pattern 303 without a connection electrode. Thus, potential problems due to a disconnection of the connection electrode may be prevented.

Embodiments may be applied to an electronic device having a display apparatus. For example, embodiments may be applied to a television, a computer monitor, a laptop, a digital camera, a cellular phone, a smart phone, a tablet Personal Computer (PC), a smart pad, a Personal Digital Assistant (PDA), a Portable Multimedia Player (PMP), an MP3 player, a navigation system, a camcorder, a portable game console, etc.

Although a few embodiments have been described, those skilled in the art will readily appreciate that many modifications are possible in the embodiments. All such modifications are intended to be included within the scope as defined in the claims.

What is claimed is:

1. A substrate structure comprising:
a base substrate comprising a display area and a peripheral area adjacent to the display area;
a gate metal pattern comprising a gate electrode of a transistor disposed on the display area and comprising a gate metal member disposed on the peripheral area, wherein the gate electrode of the transistor overlaps a face of the base substrate;
a gate insulating member disposed on the gate metal pattern;
a semiconductor layer disposed on the gate insulating member, comprising a channel portion of the transistor disposed on the display area, and comprising a semiconductor member disposed on the peripheral area;
a first insulating layer disposed on the semiconductor layer; and
a data metal pattern disposed on the first insulating layer, comprising a source electrode of the transistor disposed on the display area, and comprising a data metal member disposed on the peripheral area, wherein the data metal member directly contacts the semiconductor member and is electrically connected to the gate metal member, and wherein a maximum thickness of the data metal member in a direction perpendicular to the face of the base substrate is greater than a maximum thickness of the semiconductor member in the direction perpendicular to the face of the base substrate.

2. The substrate structure of claim 1, further comprising:
a connection electrode electrically connecting the gate metal member to the data metal member.

3. The substrate structure of claim 2, wherein the connection electrode directly contacts each of the gate metal member and the data metal member.

4. The substrate structure of claim 2, wherein the connection electrode electrically connects the gate metal member to the data metal member through a contact hole formed through both the first insulating layer and the gate insulating member.

5. The substrate structure of claim 2, further comprising:
a second insulating layer disposed on the data metal member, wherein each of the first insulating layer, the gate insulating member, and the data metal member is disposed between the second insulating layer and the base substrate.

6. The substrate structure of claim 5, wherein the connection electrode directly contacts the second insulating layer.

7. The substrate structure of claim 5, wherein the connection electrode electrically connects the gate metal member to the data metal member through a contact hole formed through the first insulating layer, the second insulating layer, and the gate insulating member.

8. The substrate structure of claim 1, wherein the gate metal member directly contacts the data metal member.

9. The substrate structure of claim 1, further comprising:
a data driving part configured to output a data signal, wherein the gate metal member, the semiconductor member, and the data metal member are disposed between the display area and the data driving part.

10. The substrate structure of claim 9, wherein the gate metal member, the semiconductor member, and the data metal member form at least one of a static electricity prevention diode, a static electricity prevention transistor and a static electricity prevention capacitor.

11. The substrate structure of claim 1, wherein the gate metal member, the semiconductor member, and the data metal member form a gate driving part configured to provide gate signals.

12. The substrate structure of claim 1, wherein the data metal member directly contacts at least three faces of the semiconductor member.

13. A method of manufacturing a substrate structure, the method comprising:
forming a gate metal pattern on a base substrate, the base substrate comprising a display area and a peripheral area adjacent to the display area, the gate metal pattern comprising a gate electrode of a transistor disposed on the display area and comprising a gate metal member disposed on the peripheral area, wherein the gate electrode of the transistor overlaps a face of the base substrate;
forming a gate insulating member on the gate metal pattern;
forming a semiconductor layer on the gate insulating member, the semiconductor layer comprising a channel portion of the transistor disposed on the display area and comprising a semiconductor member disposed on the peripheral area;
forming a first insulating layer on the semiconductor layer; and
forming a data metal pattern on the first insulating layer, the data metal pattern comprising a source electrode of the transistor disposed on the display area and comprising a data metal member disposed on the peripheral area, wherein the data metal member directly contacts the semiconductor member and is electrically connected to the gate metal member, and wherein a maximum thickness of the data metal member in a direction perpendicular to the face of the base substrate is greater than a maximum thickness of the semiconductor member in the direction perpendicular to the face of the base substrate.

14. The method of claim 13, further comprising:
forming a connection electrode electrically connecting the gate metal member to the data metal member.

15. The method of claim 14, wherein the connection electrode electrically connects the gate metal member to the data metal member through a contact hole formed through both the first insulating layer and the gate insulating member.

16. The method of claim 13, further comprising:
forming a second insulating layer on the data metal member, wherein each of the first insulating layer, the gate insulating member, and the data metal member is disposed between the second insulating layer and the base substrate.

17. The method of claim 16, further comprising:
forming a connection electrode electrically connecting the gate metal member to the data metal member, wherein the connection electrode directly contacts the second insulating layer.

18. The method of claim 17, wherein the connection electrode electrically connects the gate metal member to the data metal member through a contact hole formed through the first insulating layer, the second insulating layer, and the gate insulating member.

19. The method of claim 13, wherein the data metal member directly contacts a first portion of the semiconductor member through a first contact hole, wherein the data metal member directly contacts a second portion of the semiconductor member through a second contact hole spaced from the first contact hole, and wherein the first portion of the semiconductor member is disposed closer to the base substrate than the second portion of the semiconductor member.

20. The method of claim 13, wherein the gate metal member directly contacts the data metal member.

* * * * *